(12) United States Patent
Hartnett et al.

(10) Patent No.: US 12,566,900 B2
(45) Date of Patent: Mar. 3, 2026

(54) SYSTEMS, METHODS, AND COMPUTER PROGRAM PRODUCTS FOR SEVERITY CLASSIFICATIONS OF SIMULATED COLLISIONS

(71) Applicant: FORD GLOBAL TECHNOLOGIES, LLC, Dearborn, MI (US)

(72) Inventors: Andrew Hartnett, Pittsburgh, PA (US); Steven DiBerardino, Pittsburgh, PA (US); Timothy Andrew Potts, Jr., Pittsburgh, PA (US)

(73) Assignee: Ford Global Technologies, LLC, Dearborn, MI (US)

( * ) Notice: Subject to any disclaimer, the term of this patent is extended or adjusted under 35 U.S.C. 154(b) by 1165 days.

(21) Appl. No.: 17/509,732

(22) Filed: Oct. 25, 2021

(65) Prior Publication Data

US 2023/0131632 A1     Apr. 27, 2023

(51) Int. Cl.
G06F 30/20        (2020.01)
B60W 30/09        (2012.01)
(Continued)

(52) U.S. Cl.
CPC ............. G06F 30/20 (2020.01); B60W 30/09 (2013.01); B60W 30/0956 (2013.01); B60W 60/0015 (2020.02)

(58) Field of Classification Search
CPC .......... G06F 30/20; G06F 30/25; G06F 30/27; G06F 30/28; G06F 2111/00;
(Continued)

(56) References Cited

U.S. PATENT DOCUMENTS 6,195,625 B1 *   2/2001   Day ........................ G06T 19/20
                                          703/7
11,161,500 B1 *  11/2021  Kavadia .............. G05D 1/0088
                         (Continued)

FOREIGN PATENT DOCUMENTS

KR      1020190069457 A      6/2019

OTHER PUBLICATIONS

International Search Report and Written Opinion of PCT/US2022/047120 mailed Feb. 3, 2023, 6 pages.
(Continued)

*Primary Examiner* — Kibrom K Gebresilassie
(74) *Attorney, Agent, or Firm* — Frank A. MacKenzie; Brooks Kushman P.C.

(57)        ABSTRACT

Provided are systems, methods, and computer program products for severity classification of simulated collisions in self-driving systems of simulated environments, comprising controlling a simulated autonomous vehicle (AV) in a road during a plurality of simulated driving scenarios involving a road actor, automatically detecting a collision based on an intersection between affected portions of a simulated AV and affected portions the road actor, generating a plurality of collision impact scores, wherein each impact score of the plurality of collision impact scores signals a severity of a different impact type of collision, and classifying the severity of the collision based on the plurality of collision impact scores for the affected portion of the simulated AV and road actor.

18 Claims, 8 Drawing Sheets

(51) Int. Cl.
_B60W 30/095_ (2012.01)
_B60W 60/00_ (2020.01)

(58) Field of Classification Search
CPC ........... G06F 2119/22; B60W 60/0015; B60W
30/09; B60W 30/0956
See application file for complete search history.

(56) References Cited

U.S. PATENT DOCUMENTS

| | | | |
|---|---|---|---|
| 11,436,685 B1 * | 9/2022 | Konrardy ................. | B60Q 9/00 |
| 2012/0136640 A1 | 5/2012 | Ito et al. | |
| 2012/0265698 A1 | 10/2012 | Kidd et al. | |
| 2016/0086285 A1 * | 3/2016 | Jordan Peters .. | G08G 1/096827 |
| | | | 701/484 |
| 2018/0293552 A1 | 10/2018 | Zhang et al. | |
| 2018/0322230 A1 | 11/2018 | Han | |
| 2019/0011931 A1 | 1/2019 | Selvam et al. | |

OTHER PUBLICATIONS

International Preliminary Report on Patentability of PCT/US2022/047120 mailed Apr. 30, 2024, 4 pages.

\* cited by examiner

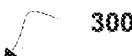

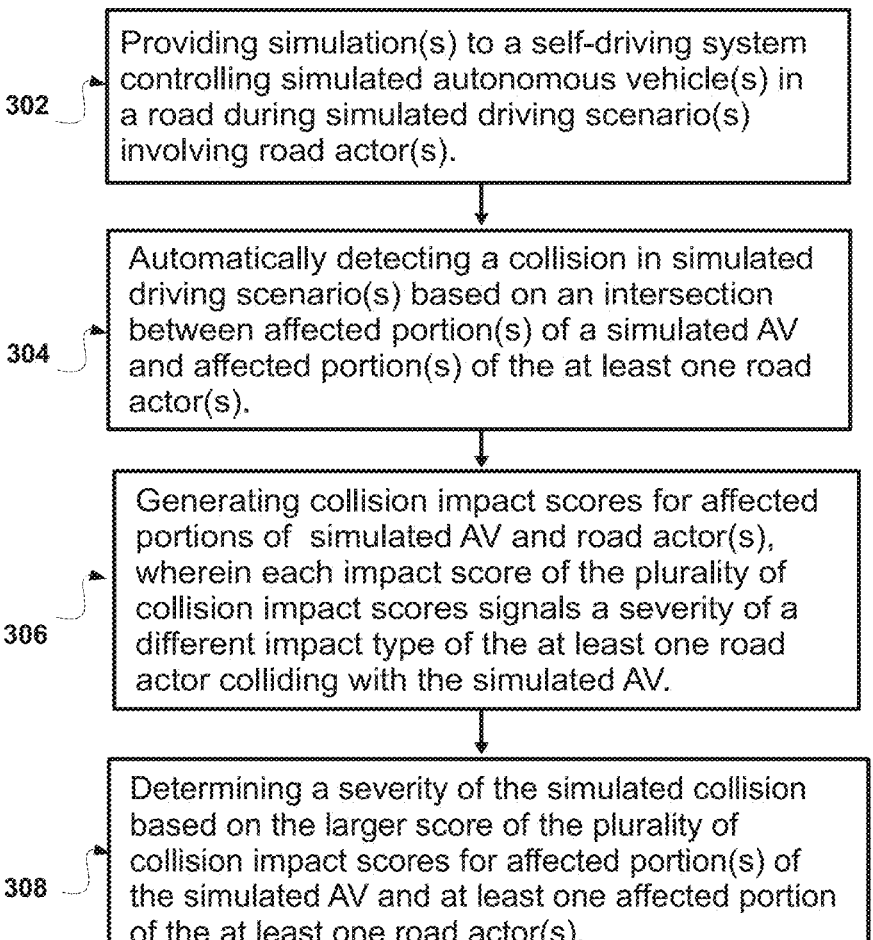

302 — Providing simulation(s) to a self-driving system controlling simulated autonomous vehicle(s) in a road during simulated driving scenario(s) involving road actor(s).

304 — Automatically detecting a collision in simulated driving scenario(s) based on an intersection between affected portion(s) of a simulated AV and affected portion(s) of the at least one road actor(s).

306 — Generating collision impact scores for affected portions of simulated AV and road actor(s), wherein each impact score of the plurality of collision impact scores signals a severity of a different impact type of the at least one road actor colliding with the simulated AV.

308 — Determining a severity of the simulated collision based on the larger score of the plurality of collision impact scores for affected portion(s) of the simulated AV and at least one affected portion of the at least one road actor(s).

FIG. 3

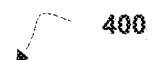
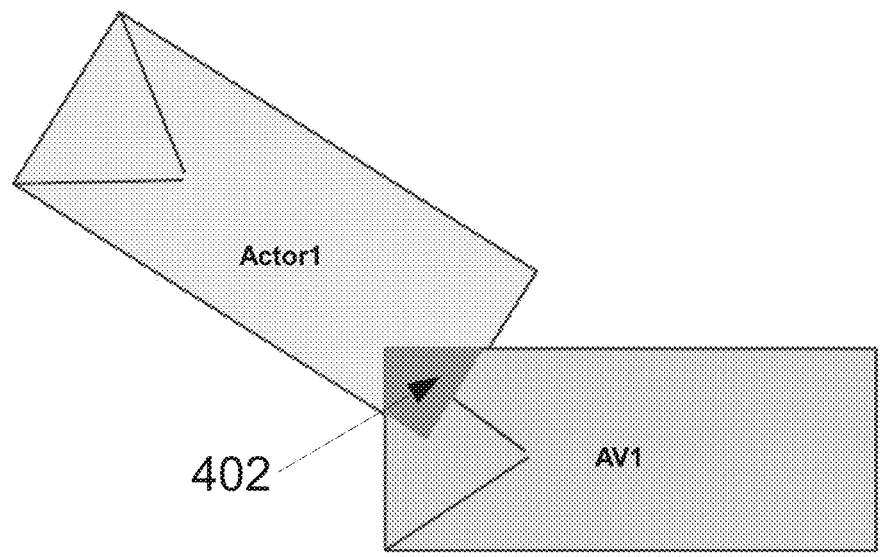
402
FIG. 4A

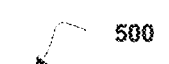
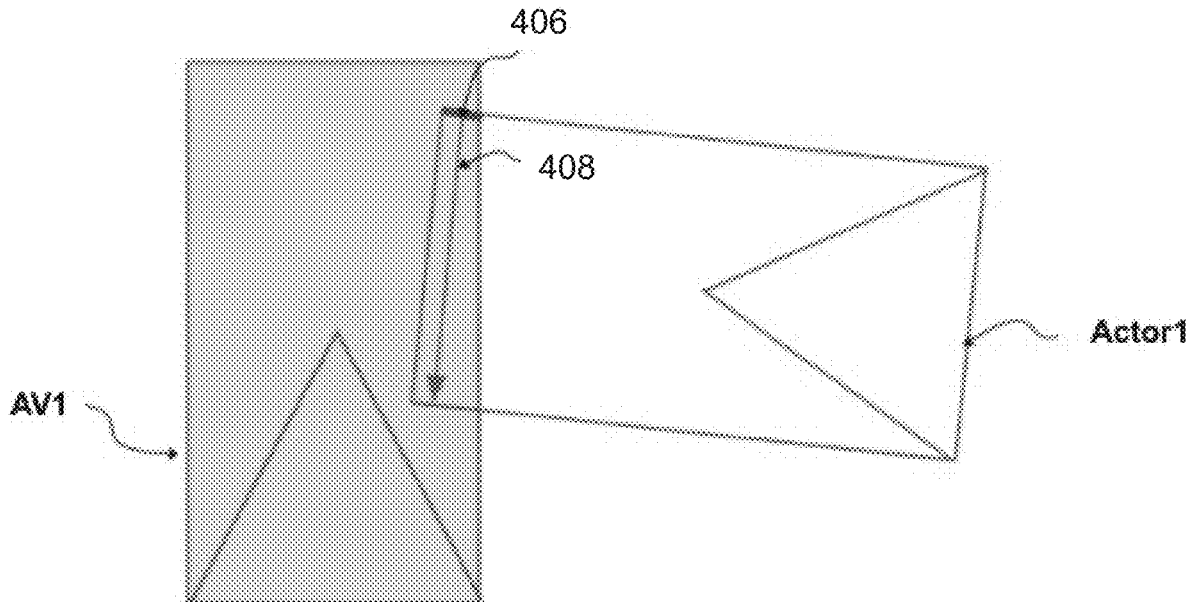
FIG. 5A

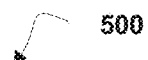
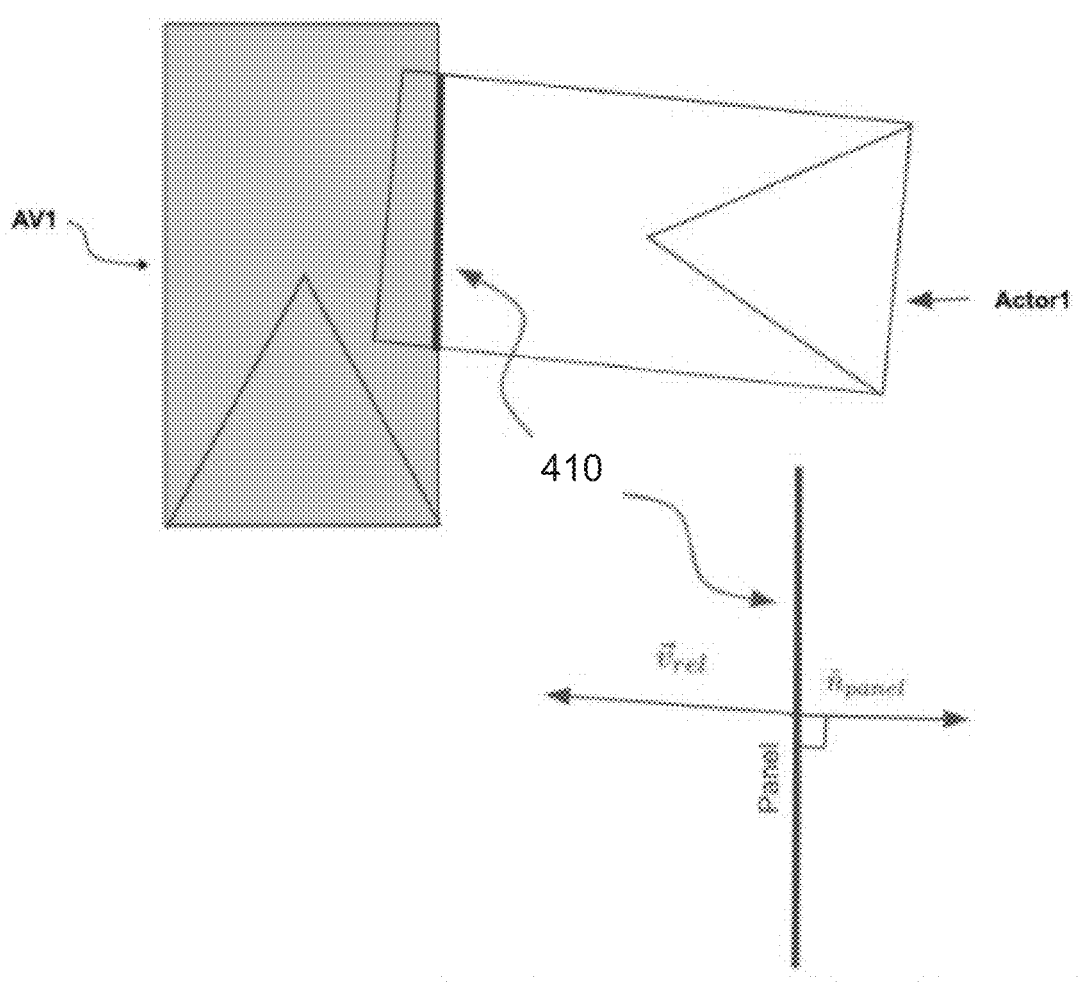
FIG. 5B

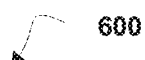
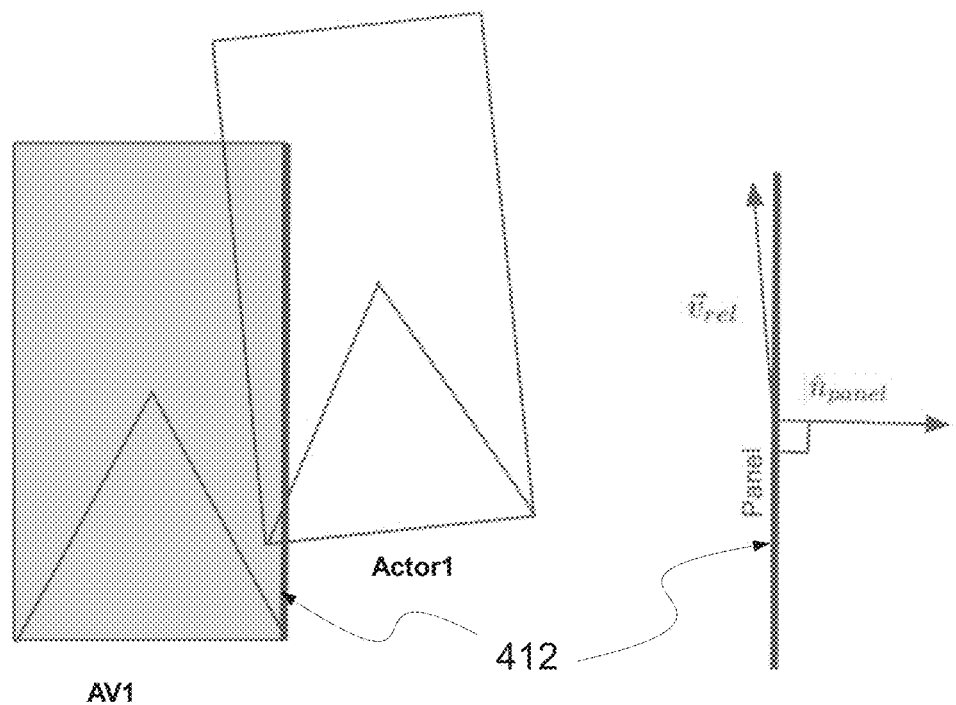
FIG. 6

SYSTEMS, METHODS, AND COMPUTER PROGRAM PRODUCTS FOR SEVERITY CLASSIFICATIONS OF SIMULATED COLLISIONS

BACKGROUND

Field

This disclosure relates generally to collision detection of simulated collisions in simulated driving systems, such as severity classification of simulated collisions, simulations for severity classification in self-driving systems operating in a simulated environment, and self-driving systems controlling simulated autonomous vehicle operations during a simulated collision involving a road actor.

Description of Related Art

A self-driving car simulator (e.g. autonomous vehicle simulator, self-driving system simulator, etc.) provides software systems used to test and validate the navigation algorithms of autonomous vehicles. To improve the navigation algorithms, the self-driving system is regularly tested on simulated scenarios involving other road actors. In some scenarios, the simulated autonomous vehicle ("AV") collides with other simulated actors in a simulated road.

Simulated testing enables the creation of a virtual world in which AV capabilities are tested under a wide variety of scenarios. Virtual testing enables simulation, re-simulation, and play-forward where a scenario can be reconfigured with different parameters to determine how an AV will react given a specified set of constraints under which to operate.

The self-driving car simulator may act as a testing ground for an AV before being rolled out onto the roads. The simulator is capable of producing real-life scenarios to stretch the limits and capabilities of the AV and its components during operation and navigation simulations. The simulator is also capable of adjusting factors, such as varying weather conditions and sensor readings to differ from a real-life simulation, so that engineers can study and predict how an AV will react while navigating the same driving scenario, but under different conditions.

In existing systems, the simulated collisions of the self-driving system are analyzed by engineers and developers specializing in different aspects of self-driving, so that the AV can be improved to properly react to conditions allowing the AV to avoid the simulated collisions the next time the same conditions are encountered. The self-driving simulator is more flexible than real-world vehicles, as it can be used nightly to reenact difficult scenarios to ensure that navigational systems do not ever regress (i.e., the performance of the self-driving system in a simulated scenario does not worsen over time). The self-driving simulator is also regularly operated on simulated scenarios involving other road actors. For example, in some scenarios, while the simulated AV is navigating a road, it may collide with other simulated road actors for various reasons. These simulated collisions are then studied by specialized teams so that the AV self-driving system (SDS) can be improved to avoid the simulated collisions.

SUMMARY

Accordingly, disclosed are improved computer-implemented systems, methods, and computer program products for severity classification in a detected collision.

According to non-limiting embodiments or aspects, provided is a computer-implemented method for generating a severity score in a simulated collision, comprising: providing, by one or more processors, simulations to a self-driving system operating in a simulated environment, the self-driving system controlling a simulated autonomous vehicle (AV) in a road during a plurality of simulated driving scenarios involving at least one road actor; automatically detecting, by the one or more processors, a collision in a simulated driving scenario of the plurality of simulated driving scenarios based on an intersection between one or more affected portions of the simulated AV and at least one affected portion of the at least one road actor; generating, by the one or more processors, a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classifying, by the one or more processors, the severity of the collision based on the larger score of the plurality of collision impact scores for the affected portion of the simulated AV and at least one affected portion of the at least one road actor.

In some non-limiting embodiments or aspects, the computer-implemented method further includes the simulated AV comprises a simulated bounding box including a plurality of panels that correspond to a surface of the simulated AV, wherein the at least one road actor comprises the simulated bounding box including a plurality of panels that correspond to a surface of a real world vehicle, or alternatively, a simulated polygon representing a non-vehicle object in the road, and wherein the intersection between the one or more affected portions of the simulated AV and the at least one affected portion of the at least one road actor is determined by checking each panel of the plurality of panels of the simulated bounding box of the simulated AV for an intersection with the simulated bounding box of the at least one road actor, or alternatively, a bounding polygon representing the non-vehicle object, and further wherein the intersection between the at least one affected portion of the at least one road actor and of the one or more affected portions of the simulated AV is determined by checking each panel of the plurality of panels of the simulated bounding box of the at least one road actor for an intersection with the simulated bounding box of the simulated AV.

In some non-limiting embodiments or aspects, the computer-implemented method further includes the one or more affected portions of the simulated AV and the at least one affected portion of the at least one road actor comprise a plurality of affected panels, and further comprising generating a scenario in a simulated environment based on at least one of a simulation, a resimulation, or a playforward, wherein the simulated environment comprises virtual roadways mirroring roads in a real environment.

In some non-limiting embodiments or aspects, the computer-implemented method further includes calculating an intersection polygon in an area defined by the plurality of affected panels, the intersection polygon representing an area intersecting the one or more affected portions of the simulated AV and the at least one affected portion of the at least one road actor.

In some non-limiting embodiments or aspects, the computer-implemented method further includes calculating, for each panel of the plurality of affected panels, a collision depth including a minimum distance required to move the simulated bounding box of the at least one road actor along a normal vector of an affected panel of the plurality of affected panels, to a position where no intersection is determined to be present.

In some non-limiting embodiments or aspects, the computer-implemented method further includes generating the plurality of collision impact scores, further comprises: generating for each affected panel of the plurality of panels, a compression impact score and a shear impact score, wherein the compression impact score for the simulated collision, signals a severity of a direct impact force received on the simulated AV by the at least one road actor while moving toward the center of the affected panel of the plurality of affected panels, and based on a component of the relative velocity determined to be orthogonal to a plane of the affected panel, provides the velocity of the at least one road actor perpendicular to a plane on the surface of the road actor, and wherein a shear impact score of the simulated collision, signals a severity of a sliding force received by the simulated AV by the at least one road actor, moving laterally into the affected panel of the plurality of affected panels, and based on the component of the other mover's relative velocity which is determined to be parallel to the surface of the panel.

In some non-limiting embodiments or aspects, the computer-implemented method further includes one or more of the collision impact scores are calculated only for affected panels which overlap with the at least one road actor by more than a predetermined threshold.

In some non-limiting embodiments or aspects, the computer-implemented method further includes a discount penalty is applied to the shear impact score to compensate for shallow collisions.

In some non-limiting embodiments or aspects, the computer-implemented method further includes a mirror-threshold for eliminating a shear impact score, wherein a shear impact score is eliminated if an intersection depth of the affected panel is less than a distance a mirror extends outward from the surface of the simulated AV.

In some non-limiting embodiments or aspects, the computer-implemented method further includes classifying the severity of the collision, and further comprises: generating the plurality of impact scores to include a plurality of score levels; automatically forming a dependency between the impact scores and a plurality of factors for controlling the simulated AV; and updating a self-driving system based on an impact score generated for a simulated collision.

In some non-limiting embodiments or aspects, the computer-implemented method further includes updating the self-driving system further comprises configuring the self-driving system for an evasive move in response to perceived information of the simulated AV, based on classifying one or more simulated collisions, wherein the evasive move avoids a simulated collision previously classified based on a dependency with at least one of: a shear impact score, a compression impact score, a side swipe impact score, a rear-end impact score, or a non-vehicle object impact score, and the plurality of factors includes at least one of: the one or more affected portions of the simulated AV, the at least one affected portion of the at least one road actor, the simulated bounding box of the AV, the simulated bounding box of the at least one road actor; and classifying a simulated collision with the one or more of the impact scores only for a panel of the simulated AV that overlap with the at least one road actor by more than a predetermined threshold.

According to non-limiting embodiments or aspects, provided is a system for severity classification with a simulated collision, comprising: a memory; and one or more processors coupled to the memory, and configured to: provide simulations to a self-driving system operating in a simulated environment, the self-driving system controlling a simulated autonomous vehicle (AV) in a road during a plurality of simulated driving scenarios involving at least one road actor; automatically detect a collision in a simulated driving scenario of the plurality of simulated driving scenarios based on an intersection between one or more affected portions of a simulated AV and at least one affected portion of the at least one road actor; generate a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classify the severity of the collision based on the larger score of the plurality of collision impact scores for the affected portion of the simulated AV and at least one affected portion of the at least one road actor.

According to non-limiting embodiments or aspects, provided is a computer program product for severity classification of simulated collisions, comprising at least one non-transitory computer-readable medium including one or more instructions that, when executed by at least one processor, cause the one or more processors to: provide simulations to a self-driving system operating in a simulated environment, the self-driving system controlling a simulated autonomous vehicle (AV) in a road during a plurality of simulated driving scenarios involving at least one road actor; automatically detect a collision in a simulated driving scenario of the plurality of simulated driving scenarios based on an intersection between one or more affected portions of a simulated AV and at least one affected portion of the at least one road actor; generate a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classify the severity of the collision based on the larger score of the plurality of collision impact scores for the affected portion of the simulated AV and at least one affected portion of the at least one road actor.

Further non-limiting embodiments or aspects are set forth in the following numbered clauses:

Clause 1: A computer-implemented method for generating a severity score in a simulated collision, comprising: providing, by one or more processors, simulations to a self-driving system operating in a simulated environment, the self-driving system controlling a simulated autonomous vehicle (AV) in a road during a plurality of simulated driving scenarios involving at least one road actor; automatically detecting, by the one or more processors, a collision in a simulated driving scenario of the plurality of simulated driving scenarios based on an intersection between one or more affected portions of the simulated AV and at least one affected portion of the at least one road actor; generating, by the one or more processors, a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classifying, by the one or more processors, the severity of the collision based on the larger score of the plurality of collision impact scores for the affected portion of the simulated AV and at least one affected portion of the at least one road actor.

Clause 2: The computer-implemented method of clause 1, wherein the simulated AV comprises a simulated bounding box including a plurality of panels that correspond to a surface of the simulated AV, wherein the at least one road actor comprises the simulated bounding box including a plurality of panels that correspond to a surface of a real world vehicle, or alternatively, a simulated polygon representing a non-vehicle object in the road, and wherein the intersection between the one or more affected portions of the simulated AV and the at least one affected portion of the at least one road actor is determined by checking each panel of the plurality of panels of the simulated bounding box of the simulated AV for an intersection with the simulated bounding box of the at least one road actor, or alternatively, a bounding polygon representing the non-vehicle object, and further wherein the intersection between the at least one affected portion of the at least one road actor and of the one or more affected portions of the simulated AV is determined by checking each panel of the plurality of panels of the simulated bounding box of the at least one road actor for an intersection with the simulated bounding box of the simulated AV.

Clause 3: The computer-implemented method of clauses 1-2, wherein the one or more affected portions of the simulated AV and the at least one affected portion of the at least one road actor comprise a plurality of affected panels, and further comprising generating a scenario in a simulated environment based on at least one of a simulation, a resimulation, or a playforward, wherein the simulated environment comprises virtual roadways mirroring roads in a real environment.

Clause 4: The computer-implemented method of clauses 1-3, further comprising: calculating an intersection polygon in an area defined by the plurality of affected panels, the intersection polygon representing an area intersecting the one or more affected portions of the simulated AV and the at least one affected portion of the at least one road actor.

Clause 5: The computer-implemented method of clauses 1-4, further comprising calculating, for each panel of the plurality of affected panels, a collision depth including a minimum distance required to move the simulated bounding box of the at least one road actor along a normal vector of an affected panel of the plurality of affected panels, to a position where no intersection is determined to be present.

Clause 6: The computer-implemented method of clauses 1-5, wherein generating the plurality of collision impact scores, further comprises: generating for each affected panel of the plurality of panels, a compression impact score and a shear impact score, wherein the compression impact score for the simulated collision, signals a severity of a direct impact force received on the simulated AV by the at least one road actor while moving toward the center of the affected panel of the plurality of affected panels, and based on a component of the relative velocity determined to be orthogonal to a plane of the affected panel, provides the velocity of the at least one road actor perpendicular to a plane on the surface of the road actor, and wherein a shear impact score of the simulated collision, signals a severity of a sliding force received by the simulated AV by the at least one road actor, moving laterally into the affected panel of the plurality of affected panels, and based on the component of the other mover's relative velocity which is determined to be parallel to the surface of the panel.

Clause 7: The computer-implemented method of clauses 1-6, wherein one or more of the collision impact scores are calculated only for affected panels which overlap with the at least one road actor by more than a predetermined threshold.

Clause 8: The computer-implemented method of clauses 1-7, wherein a discount penalty is applied to the shear impact score to compensate for shallow collisions.

Clause 9: The computer-implemented method of clauses 1-8, further comprises a mirror-threshold for eliminating a shear impact score, wherein a shear impact score is eliminated if an intersection depth of the affected panel is less than a distance a mirror extends outward from the surface of the simulated AV.

Clause 10: The computer-implemented method of clauses 1-9, wherein classifying the severity of the collision, further comprises: generating the plurality of impact scores to include a plurality of score levels; automatically forming a dependency between the impact scores and a plurality of factors for controlling the simulated AV; and updating a self-driving system based on an impact score generated for a simulated collision.

Clause 11: The computer-implemented method of clauses 1-10, wherein updating the self-driving system further comprises configuring the self-driving system for an evasive move in response to perceived information of the simulated AV, based on classifying one or more simulated collisions, wherein the evasive move avoids a simulated collision previously classified based on a dependency with at least one of: a shear impact score, a compression impact score, a side swipe impact score, a rear-end impact score, or a non-vehicle object impact score, and wherein the plurality of factors includes at least one of: the one or more affected portions of the simulated AV, the at least one affected portion of the at least one road actor, the simulated bounding box of the AV, the simulated bounding box of the at least one road actor; and classifying a simulated collision with the one or more of the impact scores only for a panel of the simulated AV that overlap with the at least one road actor by more than a predetermined threshold.

Clause 12: A system for severity classification with a simulated collision, comprising: a memory; and one or more processors coupled to the memory, and configured to: provide simulations to a self-driving system operating in a simulated environment, the self-driving system controlling a simulated autonomous vehicle (AV) in a road during a plurality of simulated driving scenarios involving at least one road actor; automatically detect a collision in a simulated driving scenario of the plurality of simulated driving scenarios based on an intersection between one or more affected portions of a simulated AV and at least one affected portion of the at least one road actor; generate a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classify the severity of the collision based on the larger score of the plurality of collision impact scores for the affected portion of the simulated AV and at least one affected portion of the at least one road actor.

Clause 13. The system of clause 12, wherein the simulated AV comprises the simulated bounding box including a plurality of panels that correspond to a surface of the simulated AV, wherein the at least one road actor comprises the simulated bounding box including a plurality of panels that correspond to a surface of a real world vehicle, or alternatively, a simulated polygon representing a non-vehicle object in the road, and the intersection between the one or more affected portions of the simulated AV and the at least one affected portion of the at least one road actor is determined by checking each panel of the plurality of panels of the simulated bounding box of the simulated AV for an intersection with the simulated bounding box of the at least one road actor, or alternatively, a bounding polygon representing the non-vehicle object, and further wherein the intersection between the at least one affected portion of the at least one road actor and of the one or more affected portions of the simulated AV is determined by checking each panel of the plurality of panels of the simulated bounding box of the at least one road actor for an intersection with the simulated bounding box of the simulated AV.

Clause 14: The system of clauses 12-13, wherein the one or more affected portions of the simulated AV and the at least one affected portion of the at least one road actor comprise a plurality of affected panels, and further comprising generating a scenario in a simulated environment based on at least one of a simulation, a resimulation, or a playforward, wherein the simulated environment comprises virtual roadways mirroring roads in a real environment.

Clause 15: The system of clauses 12-14, wherein the one or more processors are further configured to: calculate an intersection polygon in an area defined by the plurality of affected panels, the intersection polygon representing an area intersecting the one or more affected portions of the simulated AV and the at least one affected portion of the at least one road actor.

Clause 16: The system of clauses 12-15, wherein the one or more processors are further configured to: calculate, for each panel of the plurality of affected panels, a collision depth including a minimum distance required to move the simulated bounding box of the at least one road actor along a normal vector of an affected panel of the plurality of affected panels, to a position where no intersection is determined to be present.

Clause 17: The system of clauses 12-16, wherein the one or more processors generating a plurality of collision impact scores, are further configured to: generate for each affected panel of the plurality of panels, a compression impact score and a shear impact score, wherein the compression impact score for the simulated collision, signals a severity of a direct impact force received on the simulated AV by the at least one road actor while moving toward the center of the affected panel of the plurality of affected panels, and based on a component of the relative velocity determined to be orthogonal to a plane of the affected panel, provides the velocity of the at least one road actor perpendicular to a plane on the surface of the road actor, and wherein a shear impact score of the simulated collision, signals a severity of a sliding force received by the simulated AV by the at least one road actor, moving laterally into the affected panel of the plurality of affected panels, and based on the component of the other mover's relative velocity which is determined to be parallel to the surface of the panel.

Clause 18: The system of clauses 12-17, wherein one or more of the collision impact scores are calculated only for affected panels which overlap with the at least one road actor by more than a predetermined threshold.

Clause 19: The system of clauses 12-18, wherein a discount penalty is applied to the shear impact score to compensate for shallow collisions.

Clause 20. A computer program product for severity classification of simulated collisions, comprising at least one non-transitory computer-readable medium including one or more instructions that, when executed by at least one processor, cause the one or more processors to: provide simulations to a self-driving system operating in a simulated environment, the self-driving system controlling a simulated autonomous vehicle (AV) in a road during a plurality of simulated driving scenarios involving at least one road actor; automatically detect a collision in a simulated driving scenario of the plurality of simulated driving scenarios based on an intersection between one or more affected portions of a simulated AV and at least one affected portion of the at least one road actor; generate a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classify the severity of the collision based on the larger score of the plurality of collision impact scores for the affected portion of the simulated AV and at least one affected portion of the at least one road actor.

These and other features and characteristics of the present disclosure, as well as, the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the present disclosure.

These and other features and characteristics of the present disclosure, as well as, the methods of operation and functions of the related elements of structures and the combination of parts and economies of manufacture will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the present disclosure.

BRIEF DESCRIPTION OF THE DRAWINGS

Additional advantages and details of the present disclosure are explained in greater detail below with reference to the exemplary embodiments that are illustrated in the accompanying schematic figures, in which:

FIG. 3 is a step diagram of non-limiting embodiments or aspects for generating severity classifications of simulated collisions according to the principles of the present disclosure;

FIGS. 4A-4E are diagrams of non-limiting embodiments or aspects of an intersection depth of an intersection polygon with respect to affected panels of vehicles involved in a collision as shown in FIG. 1;

FIGS. 5A and 5B are diagrams of non-limiting embodiments or aspects of a T-bone collision for which a compression impact score is shown according to principles of the present disclosure; and FIG. 6 is a diagram of non-limiting embodiments or aspects of a side-swipe collision for which a shear impact score is shown according to principles of the present disclosure.

DETAILED DESCRIPTION

Figure 1:
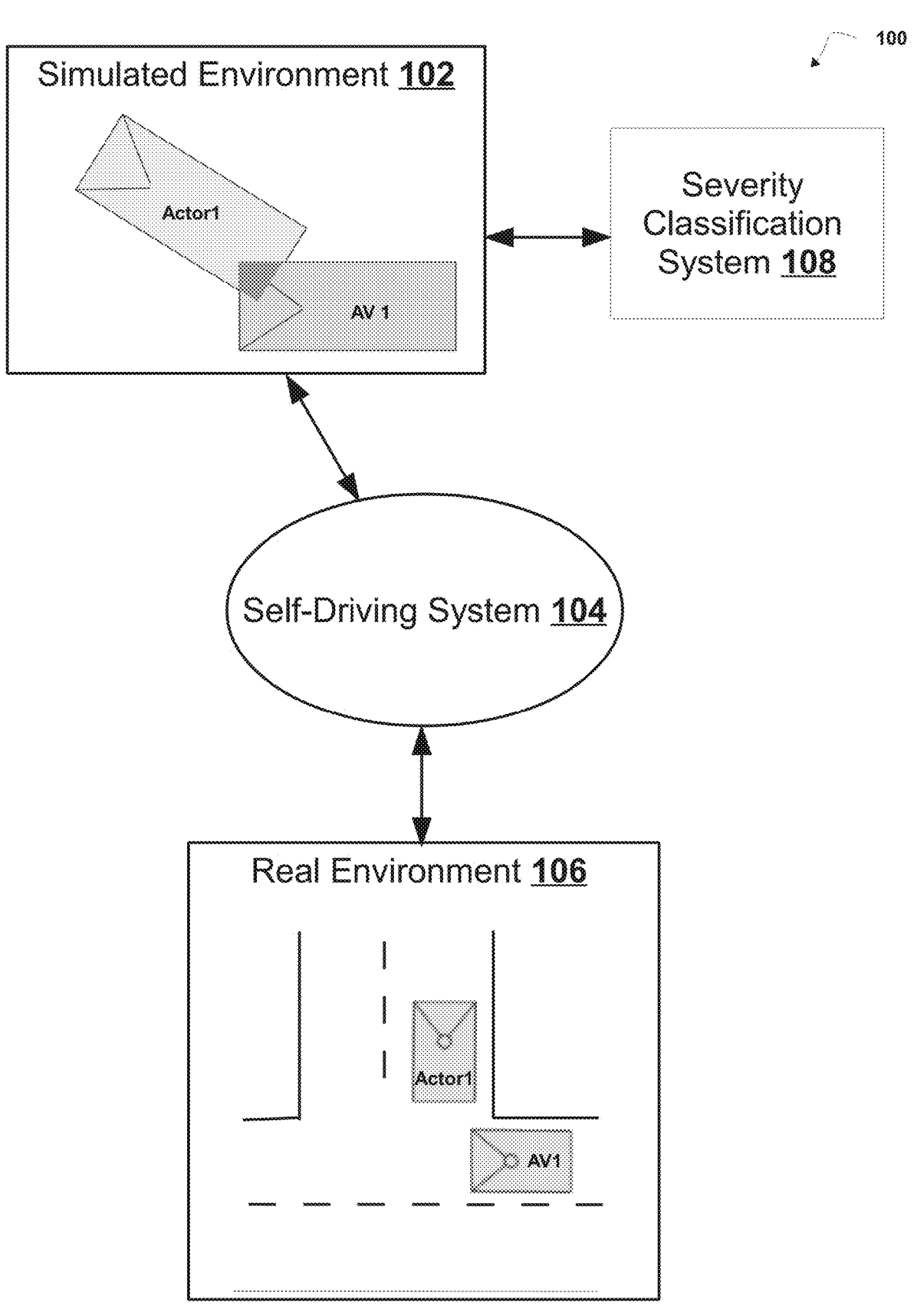
FIG. 1 is a diagram of non-limiting embodiments or aspects of a collision severity classification system for a simulated driving environment in which systems, apparatuses, and/or methods, as described herein, may be implemented.

For purposes of the description hereinafter, the terms "end," "upper," "lower," "right," "left," "vertical," "horizontal," "top," "bottom," "lateral," "longitudinal," and derivatives thereof shall relate to the disclosure as it is oriented in the drawing figures. However, it is to be understood that the disclosure may assume various alternative variations and step sequences, except where expressly specified to the contrary. It is also to be understood that the specific devices and processes illustrated in the attached drawings, and described in the following specification, are simply exemplary embodiments or aspects of the disclosure. Hence, specific dimensions and other physical characteristics related to the embodiments or aspects of the embodiments or aspects disclosed herein are not to be considered as limiting unless otherwise indicated. In addition, terms of relative position, such as, "vertical" and "horizontal" or "front" and "rear" when used, are intended to be relative to each other and need not be absolute, and only refer to one possible position of the device associated with those terms depending on the device's orientation.

No aspect, component, element, structure, act, step, function, instruction, and/or the like used herein should be construed as critical or essential unless explicitly described as such. Also, as used herein, the articles "a" and "an" are intended to include one or more items, and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise. Additionally, when terms, such as, "first" and "second" are used to modify a noun, such use is simply intended to distinguish one item from another and is not intended to require a sequential order unless specifically stated.

In some non-limiting embodiments or aspects, one or more aspects associated with downloading, checking, and executing autonomous vehicle software and systems are described herein, in connection with thresholds (e.g., a tolerance, a tolerance threshold, etc.). As used herein, satisfying a threshold may refer to a value (e.g., a score, an objective score, etc.) being greater than the threshold, more than the threshold, higher than the threshold, greater than or equal to the threshold, less than the threshold, fewer than the threshold, lower than the threshold, less than or equal to the threshold, equal to the threshold, etc.

As used herein, the terms "communication" and "communicate" may refer to the reception, receipt, transmission, transfer, provision, and/or the like of information (e.g., data, signals, messages, instructions, commands, and/or the like). For one unit (e.g., a device, a system, a component of a device or system, combinations thereof, and/or the like) to be in communication with another unit means that the one unit is able to directly or indirectly receive information from and/or send (e.g., transmit) information to the other unit. This may refer to a direct or indirect connection that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively send information to the second unit. As another example, a first unit may be in communication with a second unit if at least one intermediary unit (e.g., a third unit located between the first unit and the second unit) processes information received from the first unit and sends the processed information to the second unit. In some non-limiting embodiments or aspects, a message may refer to a network packet (e.g., a data packet and/or the like) that includes data.

As used herein, the term "computing device" may refer to one or more electronic devices configured to process data. A computing device may, in some examples, include the necessary components to receive, process, and output data, such as, a processor, a display, a memory, an input device, a network interface, and/or the like. A computing device may be included in a device on-vehicle an autonomous vehicle (AV). As an example, a computing device may include an on-vehicle specialized computer (e.g., a sensor, a controller, a data store, a communication interface, a display interface, etc.), a mobile device (e.g., a smartphone, a standard cellular phone, or an integrated cellular device,), a portable computer, a wearable device (e.g., watches, glasses, lenses, clothing, and/or the like), a personal digital assistant (PDA), and/or other like devices. A computing device may also be a desktop computer or other form of non-mobile computer.

As used herein, the terms "client" and "client device" may refer to one or more computing devices that access a service made available by a server. In some non-limiting embodiments or aspects, a "client device" may refer to one or more devices that facilitate a maneuver by an AV, such as, one or more remote devices communicating with an AV. In some non-limiting embodiments or aspects, a client device may include a computing device configured to communicate with one or more networks and/or facilitate vehicle movement, such as, but not limited to, one or more vehicle computers, one or more mobile devices, and/or other like devices.

As used herein, the term "server" may refer to or include one or more computing devices that are operated by or facilitate communication and processing for multiple parties in a network environment, such as, the Internet, although it will be appreciated that communication may be facilitated over one or more public or private network environments and that various other arrangements are possible. Further, multiple computing devices (e.g., servers, data stores, controllers, communication interfaces, mobile devices, and/or the like) directly or indirectly communicating in the network environment may constitute a "system". Reference to "a server" or "a processor," as used herein, may refer to a previously-recited server and/or processor that is recited as performing a previous step or function, a different server and/or processor, and/or a combination of servers and/or processors. For example, as used in the specification and the claims, a first server and/or a first processor that is recited as performing a first step or function may refer to the same or different server and/or a processor recited as performing a second step or function.

As used herein, the term "system" may refer to one or more computing devices or combinations of computing devices, such as, but not limited to, processors, servers, client devices, software applications, and/or other like components. In addition, reference to "a server" or "a processor," as used herein, may refer to a previously-recited server and/or processor that is recited as performing a previous step or function, a different server and/or processor, and/or a combination of servers and/or processors. For example, as used in the specification and the claims, a first server and/or a first processor that is recited as performing a first step or function may refer to the same or different server and/or a processor recited as performing a second step or function.

An "electronic device" or a "computing device" refers to a device that includes a processor and a memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions.

The terms "memory," "memory device," "data store," "data storage facility," and the like each refer to a non-transitory device on which computer-readable data, programming instructions, or both are stored. Except where specifically stated otherwise, the terms "memory," "memory device," "data store," "data storage facility," and the like are intended to include single device embodiments, embodiments in which multiple memory devices together or collectively store a set of data or instructions, as well as, individual sectors within such devices.

The terms "processor" and "processing device" refer to a hardware component of an electronic device that is configured to execute programming instructions. Except where specifically stated otherwise, the singular term "processor" or "processing device" is intended to include both single-processing device embodiments and embodiments in which multiple processing devices together or collectively perform a process.

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles (AV), aircraft, aerial drones, and the like. An AV is a vehicle having a processor, programming instructions, and drivetrain components that are controllable by the processor without requiring a human operator. An AV may be fully autonomous in that it does not require a human operator for most or all driving conditions and functions or it may be semi-autonomous in that a human operator may be required in certain conditions or for certain operations or that a human operator may override the vehicle's autonomous system and may take control of the vehicle. The AV can be a ground-based AV (e.g., car, truck, bus, etc.), an air-based AV (e.g., airplane, drone, helicopter, or other aircraft), or other types of vehicles (e.g., watercraft).

As used herein, "map data" includes data associated with a road (e.g., an identity and/or a location of a roadway of a road, an identity and/or location of a segment of a road, etc.), data associated with an object in proximity to a road (e.g., a building, a lamppost, a crosswalk, a curb of the road, etc.), data associated with a lane of a roadway (e.g., the location and/or direction of a travel lane, a parking lane, a turning lane, a bicycle lane, etc.), data associated with traffic control of a road (e.g., the location of and/or instructions associated with lane markings, traffic signs, traffic lights, etc.), and/or the like. According to some embodiments or aspects, a map of a geographic location includes one or more routes (e.g., nominal route, driving route, etc.) that include one or more roadways. According to some non-limiting embodiments or aspects, map data associated with a map of the geographic location associates the one or more roadways with an indication of whether an AV can travel on that roadway.

As used herein, a "road" refers to a paved or otherwise improved path between two places that allows for travel by a vehicle (e.g., AV). Additionally or alternatively, a road includes a roadway and a sidewalk in proximity to (e.g., adjacent, near, next to, touching, etc.) the roadway. In some non-limiting embodiments or aspects, a roadway includes a portion of a road on which a vehicle is intended to travel and is not restricted by a physical barrier or by separation so that the vehicle is able to travel laterally. Additionally or alternatively, a roadway (e.g., a road network, one or more roadway segments, etc.) includes one or more lanes in which a vehicle may operate, such as, a travel lane (e.g., a lane upon which a vehicle travels, a traffic lane, etc.), a parking lane (e.g., a lane in which a vehicle parks), a turning lane (e.g., a lane in which a vehicle turns from), and/or the like. Additionally or alternatively, a roadway includes one or more lanes in which a pedestrian, a bicycle, or other vehicle may travel, such as, a crosswalk, a bicycle lane (e.g., a lane in which a bicycle travels), a mass transit lane (e.g., a lane in which a bus may travel), and/or the like. According to some non-limiting embodiments or aspects, a roadway is connected to another roadway to form a road network, for example, a lane of a roadway is connected to another lane of the roadway and/or a lane of the roadway is connected to a lane of another roadway.

As used herein, "sensor data" includes data from one or more sensors. For example, sensor data may include light detection and ranging (LiDAR) point cloud maps (e.g., map point data, etc.) associated with a geographic location (e.g., a location in three-dimensional space relative to the LiDAR system of a mapping vehicle) of a number of points (e.g., a point cloud) that correspond to objects that have reflected a ranging laser of one or more mapping vehicles at the geographic location. As an example, sensor data may include LiDAR point cloud data that represents objects in the roadway, such as, other vehicles, pedestrians, cones, debris, etc.

In existing systems, determining a collision severity often requires time consuming and difficult decisions about characteristics and patterns of a collision occurrence. To make such decisions, details defining a collision must be gathered, studied, and classified by a triage team each night making it difficult to scale and/or integrate with a self-driving system in a timely fashion. Additionally or alternatively, as much of this work is done by hand, checking is made piecemeal or not at all, with a detrimental effect on, for example, driving conditions, efficiency, and accuracy that may not be sufficient, when it is not feasible for collision severities to receive proper attention during each nightly simulation.

Further, no common reference point exists in existing systems by which all simulated collisions may be measured, and accordingly, such existing systems may fail to accurately and sufficiently produce standardized results. Such systems may result in subjective classifications of each simulated collision that may not be accurately and efficiently correlated to each other, and thus, may fail to provide information and insight into global self-driving system.

Still further, existing systems do not account for different types of crashes, such as head-on or side swipes which may require differing measurements for classifying. In addition, or alternatively, previous systems may not accurately identify a severity of a collision, as they do not take into account an angle of a crash or may obtain or calculate insufficient dimensions in a limited representation of a vehicle and may not provide sufficient information to accurately generate a severity of a collision.

Provided are improved systems, methods, and computer program products for generating a severity classification of simulated collisions, regression testing of an AV self-driving system, and releasing an updated self-driving software to an AV system. In some non-limiting embodiments or aspects, systems are provided that can more efficiently than existing systems, automatically detect details of a simulated collision and automatically provide more accurate severity classifications associated with the simulated collision. Such systems allow an AV (e.g., a self-driving system of an AV) to more efficiently and accurately navigate a road and provide sufficient simulation information for assuring that new versions of a self-driving system are performing up to certain standards, such as, during testing. For example, testing existing software applications can be performed with severity information generated from collision simulations to ensure that a change (or addition) to the self-driving system has not degraded any previously detected collisions, and identify any previously detected collisions (or classes of collisions) that may have been accidentally reintroduced into a new build or release candidate.

In some non-limiting embodiments or aspects, the automated severity classification can be run on a schedule (e.g., each night) to provide immediate results for each collision simulation, enabling more efficient, complete, and accurate determinations of simulated collisions before they are updated to the self-driving system.

Automated collision severity classifications are also more standardized and less subjective. Automated severity classifications are governed by coding standards to ensure a consistent approach which removes subjectivity (e.g., human decisions), producing more sufficient collision classifications within a standardized result set based on a set of common reference points, which also improve the overarching accuracy of predictions about a collision.

The automated severity classification system accounts for variable factors in identifying and/or comparing multiple types of collisions (e.g., head-on, t-bone, side-swipe, etc.) in detecting or generating a collision classification. The automated severity classification system also provides a more robust representation of a vehicle, by accounting for multiple dimensions of a vehicle, and more accurately reviewing the effects of a simulated collision on each part of a simulated AV (or a road actor involved in a collision), and identifying each relevant angle of a collision. Additionally, the automated severity classification system provides details of a severity, such as multiple levels of severity, rather than a binary result indicating collision or no collision. In this way, the automated severity classification system generates a more accurate severity classification of a plurality of simulated collisions, provides more sufficient regression testing of an AV self-driving system, and more efficiently releases an updated self-driving software to an AV.

Referring now to FIG. 1, provided is an exemplary environment 100 comprising self-driving system 104, AVs (e.g., AV1), and road actors (e.g., Actor1), in which devices, systems, and/or methods, described herein, may be implemented and interact in a combination of cloud computing and on-vehicle software systems, to eliminate provide security in self-driving system 104, and ensure collisions are detected, classified, and avoided during a self-driving operation of an AV (e.g., AV1, etc.) with respect to Actor1 (a vehicle operating manually or autonomously in the same geographic area), other non-vehicle actors, or objects in or near a road being traversed by AV1, or component parts of the software release, are not altered. According to some non-limiting embodiments or aspects, environment 100 includes simulated environment 102, self-driving system 104, real environment 106, and severity classification system 108. Environment 100 can be used to control an aspect of an AV (e.g., AV1).

In some non-limiting embodiments or aspects, before self-driving system 104 reaches public roads, software functionality of self-driving system 104 is passed through a testing and release process that begins in the virtual world with the simulation of millions of scenarios and later followed by physical testing on a test track. For example, self-driving system 104 must pass each of these stages before it can be deemed ready for highly specific testing in a limited number of vehicles on public roads and before issuing a software release to an entire fleet of road-test vehicles.

After commercialization, when self-driving system 104 has been fully integrated into an AV (e.g., AV1 of simulated environment 102 AV1 of real environment 106, an automaker's products, etc.), continual improvements and refinements are made to the self-driving system 104 (e.g., expanding features, self-driving capabilities, refinements to driving style, refinements to pick-ups/drop-offs, tuning optimum performance, etc.).

Self-driving system 104 follows testing standards for each hardware and software component, at all levels of the system, including the computer hardware and sensors which generate perception and prediction information and the software that powers them.

In some non-limiting embodiments or aspects, testing methods and techniques may first include simulation, before AV1 moves to testing on closed courses, and then to public roads.

In addition, self-driving system 104 also utilizes hardware modules, including sensors and computers, which are tested to ensure the modules are automotive grade and that they pass high standards for performance and reliability in diverse environmental conditions, such as extreme heat and cold to harsh vibrations and impacts. In each case, prior to proceeding to full vehicle testing, individual testing is performed on hardware components of self-driving system 104. As an example, hardware-in-the-loop (HiL) testing involves verification of the full hardware architecture (e.g, on a testbench, test environment, other isolated environment, etc.) and allows rapid and highly repeatable testing of vehicle response to fault injection in an environment.

Software of the self-driving system 104 of environment 100 can also be checked through a verification process that involves multiple stages of code review, simulation, and testing. For example, individual software units are tested and then testing continues as self-driving system 104 integrates additional software subsystems and then test the software on target hardware.

In some non-limiting embodiments or aspects, testing of the self-driving system 104 includes virtual testing, which can occur by invoking simulated environment 102 (e.g., virtual testing environment, etc.) which generates or obtains a creation of a virtual world in which vehicles (e.g., AV1, Actor1, etc.) can interact, without a risk of real-world injury in a real-world collision, etc., with roads and other objects in a variety of random or planned testing scenarios. In some cases, virtual testing includes three main test methodologies: simulation, resimulation, and playforward.

In some non-limiting embodiments or aspects, self-driving system 104 operates on a simulation of a vast range of scenarios, such as for AV1 and Actor1 of FIG. 1, generated in simulated environment 102 Each simulation may be the resulting scenario based on road geometry, road actors, and other factors that are programmed into self-driving system 104 as part of the simulation and affect behavior. For example, the results can be built into a single street or multi-block based scenario, constructed on top of the 3D models of operational simulated cities of simulated environment 102

In some non-limiting embodiments or aspects, simulated environment 102 can be configured to include randomness (e.g., such as by adding weight, changing initial speed, adjusting initial lane positioning of the self-driving vehicle at the start of the simulation, a simulated road actor's starting position, a speed, a motion, etc.). In some examples, simulated environment 102 further alters a simulation by generating random road actors to include in a scene, or alternatively, can modify certain characteristics of a road actor, such as the state of brake lights for a parked vehicle.

Once invoked, each scenario of simulated environment 102 is evaluated through dozens of measurable metrics (e.g., vehicle passing margins, steering jerk, complex intersection patterns, random obstacle avoidance, etc.). In such scenarios, collision events which may occur are processed by severity classification system 108, corrected in self-driving system 104, and/or cycled back to development teams for review (or action). In some examples, road-testing scenarios are analyzed and then events in the road data are matched to a simulation set, and in this way, an effectiveness of the simulated environment 104 to predict the outcomes can be evaluated based on empirical data gathered from the real world, such that, virtual testing environment is authenticated, at least for a certain condition or scenario.

Figure 2:
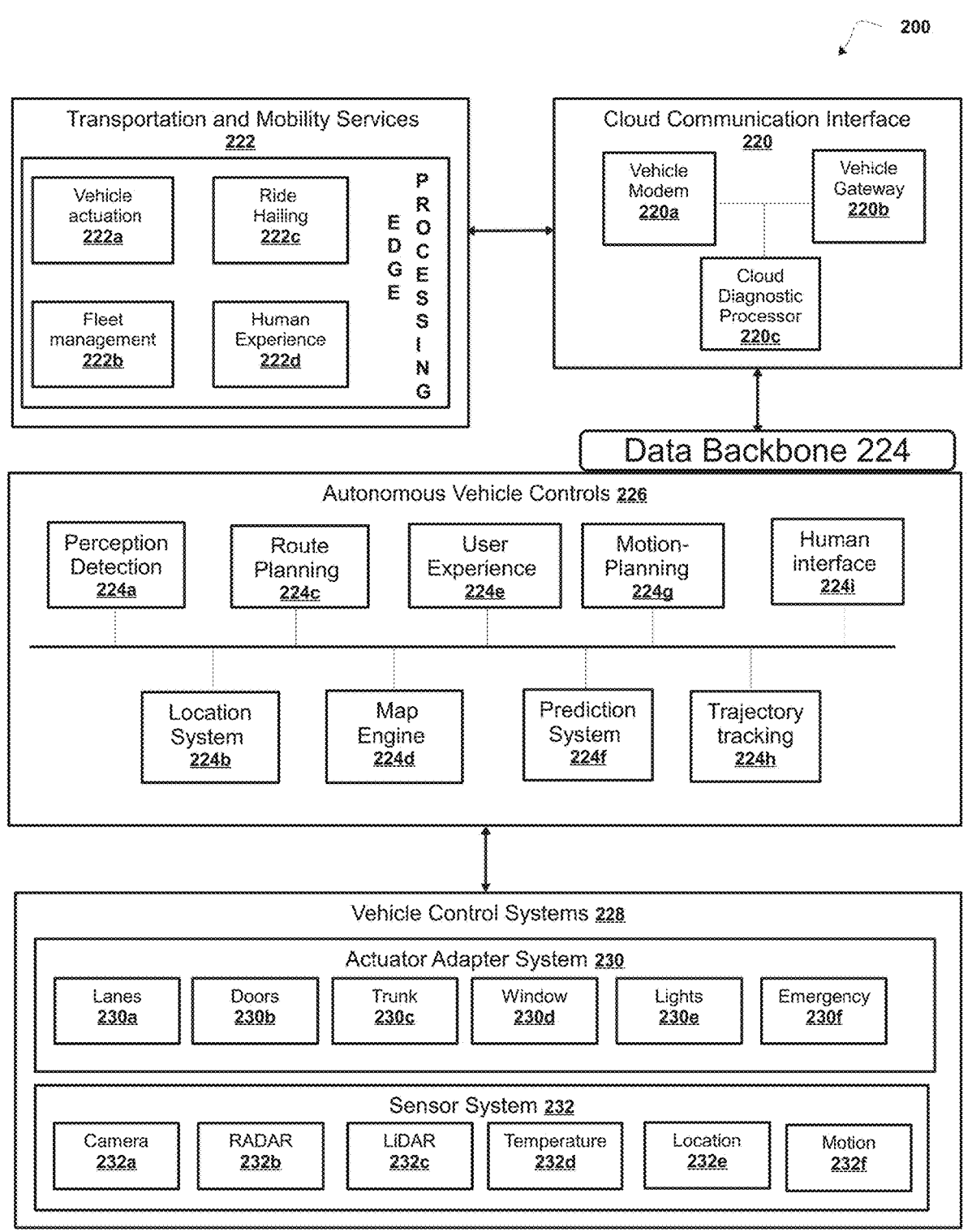
FIG. 2 is a diagram of non-limiting embodiments or aspects of an autonomous vehicle in which software releases for autonomous vehicle systems, as described herein, may be implemented.

Continuing with FIG. 1, simulated environment 102 also generates or obtains resimulations of recorded sensor data from a public road testing. In such an example, resimulation involves generation of scenarios by simulated environment 102, based on logs and/or data records that were previously generated by AV1 in the real world (e.g., real environment 106, etc.) or by an AV in the test fleet and then running new software in the simulated environment 102 based on the sensor data (e.g., typically from LiDAR, camera, radar sensors, etc.). In some examples, simulation environment 104 executes the autonomy software of self-driving system 104 (e.g., including the autonomy stack as shown in FIG. 2, such as perception, prediction, motion planning, motion control, etc.). In addition, an assessment can be generated based on the virtual performance of self-driving system 104 (e.g., an updated or new software release of self-driving system 104) that can be compared to previously stored challenging situations (e.g., one or more simulated collisions in the real environment 106, etc.).

By creating a new log from simulated behavior of self-driving system 104, performance of any individual sensor may be potentially improved. For example, resimulation enables the manipulation of inputs, so that thousands of logged and ground-truth data sets (e.g., data sets generated and stored in an AV1 of real environment 106, for example, that have been assessed and verified by software engineers, etc.) can be verified.

In some non-limiting embodiments or aspects, simulated environment 102 generates a virtual testing scenario for a collision known as playforward. Playforward is a variant of resimulation of a scenario in real environment 106 involving AV1 and Actor1, that is generated to capture new scenarios that potentially could have happened in the original scenario, but for an intervention (e.g. scenarios where a test specialist took back control of the AV (e.g., AV1) in real environment 106 due to situational factors, etc.) For example, a test specialist may have disengaged autonomous mode in AV1 at an intersection. In such an example, playforward simulation generates a likely scenario that would have occurred in the seconds after the disengagement. In this case, software updates can be developed and tested against challenging scenarios, involving collisions, which AV1 may have encountered with real sensor playback.

In some non-limiting embodiments or aspects, once a software version has passed virtual testing in simulated environment 102, a closed course test is performed on a test track (e.g., a track traffic including circles, complex intersections with traffic light controls, tight bends with reduced visibility, fog and rain generators, an area of roadway that can be automatically flooded, traffic-calming measures, typical road infrastructure such as mail boxes, street signs, and bollards, etc.) to test whether new software behaves on the test track as it did in simulation. The updated self-driving system 104 is tested first in simulation and then at the test track, against all of the functional requirements for perception, prediction, motion planning, and controls, in addition to vehicle functions as intended, and is able to make the best decisions, drive correctly, and identify and avoid objects. The next stage of release candidate testing at the test track involves driving routes and scenarios that simulate common and unusual interactions, such as a pedestrian appearing between two parked cars or a delivery vehicle pulling out suddenly.

In some non-limiting embodiments or aspects, when a test vehicle returns to the terminal, data from the road test is uploaded. This data created from the real environment 106 (e.g., a test track, etc.) may then be simulated at points of disengagement events to determine if a simulated collision occurs using playforward or resimulation and also at a number of randomly selected events.

Self-driving system 104 continually updates based on intelligence gathered from monitoring and logging data pertaining to dynamic driving environment. For example, data gathered in real environment 106 is used to develop scenario simulations related to driving interactions encountered on the road that can be processed by severity classification system 108. For example, this data can also generate new vehicle sensor classification system 108. For example, this data can also generate new vehicle sensor input, including the system's detection of external objects and Actor1, the system's tracking of the motion of objects, a prediction of next moves, and a response to new types of inputs. In some examples, onboard AV1, self-driving system 104 includes storage systems that are capable of storing continuous, data-rich driving information that can be made available during vehicle maintenance or service.

In some non-limiting embodiments or aspects, if a collision is detected, self-driving system 104 (e.g., a version of self-driving system 104 operating within an AV system of AV1 in real environment 106, self-driving system 104 operating in a real-world AV inside an AV system, etc.) will immediately bring the vehicle to a stop and log the collision event on the onboard event data recorder and the AV data-recording system for analysis purposes. In such an example, the collision event is loaded to severity classification system 108 for generating a collision severity classification score.

In the event of a collision during the development phase, any collision is identified in the data to ensure that all relevant data is logged on the onboard event-data recorder. In such an example, the collision event, as marked, can be loaded to the severity classification system 108 for generating a collision severity classification score.

In some non-limiting embodiments or aspects, an AV cloud system (not shown) transmits the software comprising self-driving system 104 to the AV1 (e.g., over a CAN, HTTP, HTTPS, Local network, etc.), or alternatively, to multiple AVs in a fleet or other subgroup at one time.

The above actions and constraints are provided for example purposes and other possible information, inferences, and/or validations are within the scope of this disclosure.

Referring now to FIG. 2, FIG. 2 is a diagram of an example vehicle computing system 200 in which devices, systems, and/or methods, described herein, may be implemented. As shown in FIG. 2, vehicle computing system 200 includes cloud communication interface 220, transportation and mobility service(s) 222, data backbone 224, autonomous vehicle controls 226, vehicle control systems 228, actuator adapter system 230, and sensor system 232.

Vehicle computing system 200 may interconnect (e.g., establish a connection to communicate and/or the like) via cloud communication interface 220 to remote cloud systems, offering cloud services, remote data, and processing systems (e.g., mobility and autonomy services and sources, computing devices, external computing systems, etc.), for example, vehicle modem 220a of vehicle computing system 200 may utilize wired connections and/or wireless connections to provide an input or output exchange with AV cloud system (e.g., one or more systems of AV cloud system, etc.) and/or one or more external Transportation as a Service ("TaaS") clouds (e.g., one or more remote external service clouds, etc.). Additionally, vehicle modem 220a may utilize wired connections and/or wireless connections to provide an input or output exchange with local vehicle systems (e.g., one or more systems of an AV, etc.). Vehicle modem 220a connects to and transmits and receives data from vehicle gateway 220b. Cloud diagnostic processor 220c provides diagnostic algorithms to process cloud service messages received by cloud communication interface 220, for example, which could provide one or more systems for staging and processing one or more blockchains received from a central or remote cloud, such as for processing data in edge processors.

Cloud communication interface 220 may comprise any type of network, such as, a local area network (LAN), a wide area network (WAN) (such as, a fleet management system utilizing a secure network, or a secure connection via the Internet, a cellular network, a satellite network, or a combination thereof, and may be wired or wireless).

With continued reference to FIG. 2, vehicle computing system 200 includes transportation and mobility services 222 that utilize edge processing and connect to cloud communication interface 220 for accessibility to cloud service communications and data backbone 224. Transportation and mobility services 222 includes on—vehicle TaaS service components for processing specified cloud services on board an AV, such as, vehicle actuation 222a, fleet management 222b, ride hailing 222c, and human experience 222d.

In some non-limiting embodiments or aspects, vehicle computing system 200 includes components for autonomous operation of the AV to store or retrieve (e.g., request, receive, etc.) vehicle information from data backbone 224 (e.g., one or more data stores and/or one or more central servers via cloud communication interface 220). For example, vehicle computing system 200 may synchronize (e.g., update, change, etc.) a subset of data residing in a data store(s) of data backbone 224 with user experience 224e, with map data (e.g., a portion or sub-map of map data in a specified geographic location) in map engine 224d, or vehicle control data in one or more vehicle control components of vehicle control systems 228 as the AV is traversing a roadway. Multiple AVs may be coupled to each other and/or coupled from a remote location to data backbone 224 via cloud communication interface 220. Data backbone(s) 224 may include more than one data store(s), such as, without limitation, map data store(s), traffic information data store(s), user experience data store(s), point of interest data store(s), trajectory data store(s), and/or the like. Data backbone 224 may comprise a data array or cluster of data servers, may replicate with one or more remote data store(s) via cloud communication interface 220, or may comprise web applications, web application servers, remote connected backend servers, or a combination thereof.

With continued reference to FIG. 2, autonomous vehicle control 226 may receive data collected by data backbone 224, one or more actuators of actuator adapter system 230, or one or more sensors of sensor system 232, analyze, and provide one or more vehicle control instructions to perception detection 224a, location system 224b, route planning 224c, map engine 224d, user experience 224e, prediction system 224f, motion planning 224g, trajectory tracking 224h, and human interface 224i.

Location system 224b may include and/or may retrieve map data (e.g., map information, etc.) from map engine 224d which provides detailed information about a surrounding environment of the AV. In some non-limiting embodiments or aspects, location system 224b may include and/or may retrieve map data (e.g., map information, etc.) that provides detailed information about the surrounding environment of the AV. The map data can provide information regarding: the identity or location of different roadways, road segments, buildings, or other objects; the location and directions of traffic lanes (e.g., the location and direction of a parking lane, a turning lane, a bicycle lane, or other lanes within a particular roadway); traffic control data (e.g., the location and instructions of signage, traffic lights, or other traffic control devices); and/or any other map data (as described above) that provides information and assists autonomous vehicle control 226 in analyzing a surrounding environment of the AV. In some non-limiting embodiments or aspects, map data may also include reference path information corresponding to common patterns of vehicle travel along one or more lanes such that a motion of an object is constrained to the reference path (e.g., locations within traffic lanes on which an object commonly travels). Such reference paths may be pre-defined, such as, the centerline of the traffic lanes. Optionally, the reference path may be generated based on historical observations of vehicles or other objects over a period of time (e.g., reference paths for straight line travel, lane merge, a turn, or the like).

In some non-limiting embodiments or aspects, location system 224b may also include and/or may receive information relating to a trip or route of a user, real-time traffic information on the route, and/or the like.

Location system 224b may also comprise and/or may communicate with route planning 224c which generates a navigation route from a start position to a destination position for AV cloud system. Route planning 224c may access map engine 224d (e.g., a central map data store stored in data pipeline) to identify possible routes and road segments where a vehicle may travel, to travel from a start position to a destination position. Route planning 224c may score the possible routes and identify a preferred route to reach the destination. For example, route planning 224c may generate a navigation route that minimizes a distance traveled or other cost function while traversing the route and may further access the traffic information and/or estimates that can affect an amount of time it will take to travel on a particular route. Depending on implementation, route planning 224c may generate one or more routes using various routing methods, such as, Dijkstra's algorithm, Bellman-Ford's algorithm, and/or the like. Route planning 224c may also use the traffic information to generate a navigation route which reflects an expected experience or condition of the route (e.g., current day of the week or current time of day, etc.), such that a route generated for travel during rush-hour may differ from a route generated for travel late at night. Route planning 224c may also generate more than one navigation route to a destination and send more than one of these navigation routes to user experience 224e (e.g., a tablet, a mobile device, etc.) for selection by a user from among various possible routes.

Perception detection 224a may detect perception information of the surrounding environment of AV during travel from the start position to the destination along the preferred route, perception detection 224a may detect objects or other roadway characteristics based on sensor data provided by sensor system 232 and information obtained by location system 224b. The perception information represents what an ordinary driver perceives in the surrounding environment of a vehicle. The perception data may include information relating to one or more objects in the environment of the AV. For example, prediction system 224f may process sensor data (e.g., from LiDAR 232c, RADAR 232b, camera 232a images, etc.) in order to identify objects and/or features in the geospatial area of the AV. Detected objects may include traffic signals, roadway boundaries, vehicles, pedestrians, and/or obstacles in the roadway, and/or the like. Perception detection 224a may use known object recognition and detection algorithms, video tracking algorithms, and computer vision algorithms (e.g., track objects frame-to-frame iteratively over a number of time periods) to determine the perception.

In some non-limiting embodiments or aspects, perception detection 224a may also determine, for one or more identified objects in the environment, a current state of the object. The state information may include, without limitation, for each object: current location; current speed and/or acceleration; current heading; current orientation; size/footprint; type (e.g., vehicle vs. pedestrian vs. bicycle vs. static object or obstacle); and/or other state information.

Prediction system 224f may predict the future locations, trajectories, and/or actions of the objects based at least in part on perception information (e.g., the state data for each object) received from perception detection 224a, the location information received from location system 224b, the sensor data, and/or any other data describing a past and/or current state of the objects, the AV, the surrounding environment, and/or their relationship(s). For example, if an object is a vehicle and the current driving environment includes an intersection, prediction system 224f may predict whether the object will likely move straight forward or make a turn. If the perception data indicates that the intersection has no traffic light, prediction system 224f may also predict whether the vehicle may fully stop prior to entering the intersection. Such predictions may be made for a given time horizon (e.g., 5 seconds in the future). In certain embodiments, prediction system 224f may provide the predicted trajectory or trajectories for each object to motion planning 224g.

Motion planning 224g may determine a motion plan for the AV based on the perception data and/or the prediction data. Specifically, given predictions about the future locations of proximate objects and other perception data, motion planning 224g can determine a motion plan for autonomously navigating a route relative to one or more objects at their future locations.

In some non-limiting embodiments or aspects, motion planning 224g may receive one or more predictions from prediction system 224f and make a decision regarding how to handle objects in the environment of the AV. For a particular object (e.g., a vehicle with a given speed, a direction, a turning angle, etc.), motion planning 224g determines whether to overtake, yield, stop, and/or pass based on, for example, traffic conditions, map data, state of the AV, and/or the like. In some non-limiting embodiments or aspects, for a given object, motion planning 224g may decide a course to handle the object and may determine one or more actions for responding to the presence of the object. For example, for a given object, motion planning 224g may decide to pass the object and then may determine whether to pass on the left side or the right side of the object (including motion parameters, such as, speed and lane change decisions). Motion planning 224g, in connection with trajectory tracking 224h, may also assess a risk of a collision between a detected object and AV. If the risk exceeds an acceptable threshold, it may determine whether a collision can be avoided if the AV follows a defined vehicle trajectory and/or implements one or more dynamically generated emergency maneuvers performed in a pre-defined time period (e.g., N milliseconds). If the collision can be avoided, then autonomous vehicle control 226 may transmit appropriate control instructions to vehicle control system 228 for execution to perform a cautious maneuver (e.g., mildly slow down, accelerate, change lane, or swerve). In contrast, if the collision cannot be avoided, then autonomous vehicle controls 226 may transmit appropriate control instructions to vehicle control system 228 for execution of an emergency maneuver (e.g., brake and/or change direction of travel).

Trajectory tracking 224h also plans a trajectory ("trajectory generation") for an AV to traverse on a pre-defined route (e.g., a nominal route generated by route planning 224c). The trajectory specifies a path for the AV, as well as, a velocity profile. Autonomous vehicle control 226 converts the trajectory into control instructions for vehicle control system 228, including but not limited to throttle/brake and steering wheel angle commands. Trajectory generation may involve making decisions relating to lane changes, such as, without limitation, whether a lane change is required, where to perform a lane change, and when to perform a lane change. Specifically, one objective of motion planning 224g is to generate a trajectory for motion of the vehicle from a start position to a destination on the nominal route, taking into account the perception and prediction data.

Motion planning 224g may generate a trajectory by performing topological planning using the topological planning techniques described herein to generate a set of constraints for each of a plurality of topologically distinct classes of trajectories, optimizing a single candidate trajectory for each class, and scoring the candidate trajectories to select an optimal trajectory. Topological classes are distinguished by the discrete actions taken with respect to obstacles or restricted map areas. Specifically, all possible trajectories in a topologically distinct class perform the same action with respect to obstacles or restricted map areas. Obstacles may include, for example, static objects, such as, traffic cones and bollards, or other road users, such as, pedestrians, cyclists, and cars (e.g., moving cars, parked cars, double parked cars, etc.). Restricted map areas may include, for example, crosswalks and intersections. Discrete actions may include, for example, to stop before or proceed through, to track ahead or behind, or to pass on the left or right of an object (e.g., obstacle, constraint, etc.).

Motion planning 224g may use the preferred route information provided by route planning 224c in combination with perception data, prediction data to select the optimal trajectory, as discussed below.

As discussed above, motion planning 224g determines or generates planning and control data regarding the movement of the AV that is transmitted to vehicle control system 228 for execution. Vehicle control system 228 may, for example, control braking via a brake controller; direction via a steering controller; speed and acceleration via a throttle controller (in a gas-powered vehicle); or a motor speed controller (such as, a current level controller in an electric vehicle); a differential gear controller (in vehicles with transmissions); and/or other controls.

Actuator adapter system 230 may include one or more actuators that are coupled to vehicle control system 228 and/or otherwise connected or included within the AV. Examples of such actuators may include, without limitation, lanes 230a that recognizes the markings on a road so that if a vehicle or other object crosses these markings, lanes 230a acts on the steering, by correcting its position. At the same time, the system may detect when the driver removes her hands from the wheel for a period of time (e.g., a few seconds), the system may be configured to play a sound and visual warning will activate so that the driver takes the car's controls once again.

Door 230b actuator modules manage all actuators in the driver or passenger door and may be directly connected to vehicle control system 228. Central locking for doors 230b and trunks 230c (e.g., tailgate, etc.), window 230d actuators, as well as, mirror adjustments are controlled by an engine control unit (e.g., ECU) under control of vehicle control system 228. Light management is also part of the functionality, including illumination of the switch panel lock and mirror heating status and entrance light for user experience. Lights 230e may increase the high beams or control other lighting, and an actuator for emergency 230f control is capable of fully stopping the vehicle in case a driver moves her hands away from the steering for a programmed period of time to understand that the driver has suffered some form of loss of consciousness.

Sensor system 232 may include one or more sensors that are coupled to vehicle control system 228 and/or otherwise connected or included within the AV. Examples of such sensors include, without limitation, LiDAR 232c, RADAR 232b, one or more cameras 232a (e.g., visible spectrum cameras, infrared cameras, etc.), temperature 232d, position sensors, location 232e (e.g., global positioning system (GPS), etc.), fuel sensors, speed sensors, odometer sensors, motion 232f (e.g., inertial measurement units (IMU), accelerometer, gyroscope, etc.), object detection sensors, such as, one or more camera humidity sensors, environmental sensors (e.g., a precipitation sensor and/or ambient temperature sensor), occupancy sensors, or the like. The sensor data can include information that describes the location of objects within the surrounding environment of the AV, information about the environment itself, information about the motion of the AV, information about a route of the AV, or the like.

The AV may further include certain components (not shown here) included in vehicles, such as, an engine, wheels, steering wheel, transmission, etc., which may be controlled by data backbone 224 or, alternatively, autonomous vehicle controls 226, using a variety of communication signals and/or commands, such as, for example, acceleration signals or commands, deceleration signals or commands, steering signals or commands, braking signals or commands, etc.

In the various embodiments discussed in this document, the description may state that the vehicle or a controller included in the vehicle (e.g., in an on-vehicle computing system) may implement programming instructions that cause the controller to make decisions and use the decisions to control operations of one or more vehicle systems via the vehicle control system of the vehicle. However, the embodiments are not limited to this arrangement, as in various embodiments, the analysis, decision making, and/or operational control may be handled in full or in part by other computing devices that are in electronic communication with the vehicle's on-vehicle controller and/or vehicle control system, such as, cloud service providers. Examples of such other computing devices include an electronic device (such as, a smartphone) associated with a person who is riding in the vehicle, as well as, a remote cloud server that is in electronic communication with the vehicle via a wireless network. The processor of any such device may perform the operations that will be discussed below.

With further reference to FIG. 2, sensor system 232 may be configured to allow communication between AV cloud system and external cloud systems, such as, for example, external devices, sensors, other vehicles, servers, data stores, databases etc. Cloud communication interface 220 may utilize any now or hereafter known protocols, protection schemes, encodings, formats, packaging, etc., such as, without limitation, Wi-Fi, an infrared link, Bluetooth®, etc. driver interface system (e.g., user experience 224e and/or human interface 224i) may be part of peripheral devices implemented within an AV including, for example, a keypad, a touch screen display device (such as, a graphical user interface ("GUI")), a microphone, and a speaker, etc. For example, an AV may include a GUI on which is displayed information of the AV, such as, by indicating or displaying data or information for one or more cloud services. The information displayed on a GUI may be through software and computer programs for AV systems, that are downloaded, checked, and executed in connection with the AV (e.g., autonomous vehicle controls 226, etc.), as described herein.

FIG. 3 is a flowchart of a non-limiting embodiment or aspect of process 300 for detection and classification of simulated collisions in AV systems (e.g., self-driving systems, an autonomy stack of FIG. 2, etc.), and eliminate collisions and unneeded maneuvers in real environment 106. In some non-limiting embodiments or aspects, one or more of the steps of process 300 are for severity classification of simulated vehicle collisions that are performed (e.g., completely, partially, and/or the like) by simulated environment 102 (e.g., one or more devices of AV simulated environment 102, one or more aspects based on data generated and/or received from simulated environment 102, etc.). In some non-limiting embodiments or aspects, one or more of the steps of process 300 may be performed (e.g., completely, partially, and/or the like) by self-driving system 104 (e.g., one or more processors of self-driving system 104 one or more processors of simulated self-driving system 104, and severity classification system 108 (e.g., one or more processors of severity classification system 108, etc.), or based on information received from autonomy systems, or alternatively, associated with other autonomy systems (e.g., an on-board AV system, data from an on-board AV service provider, data about one or more devices of on-board autonomous vehicle system 112, data about an on-vehicle service or software program, data about a device or sensor of an on-vehicle system, etc.).

As shown in FIG. 3, at step 302, process 300 may include providing a simulation to a self-driving system controlling a simulated AV in a road during simulated driving scenario involving at least one road actor. In some non-limiting embodiments or aspects, simulated environment 102 provides simulations to self-driving system 104 operating in simulated environment 102, self-driving system 104 controlling a simulated AV in a road during a plurality of simulated driving scenarios involving at least one road actor. For example, simulated environment 102 provides a simulation to self-driving system 104 controlling a simulated AV in a road during a simulated driving scenario involving Actor1 (as shown in FIG. 1). In another example, self-driving system 104 may be configured to control a simulated AV (e.g., AV1) in a simulated road during a driving scenario including Actor1, and in some cases, involving many other road actors.

The self-driving system, in some examples, controls a simulated AV in a road during a plurality of simulated driving scenarios involving Actor1 performing a same driving scenario during operation of the self-driving system with each scenario of a plurality of scenarios. In such an example, one or more parameters may be adjusted and/or recorded in simulated environment 102, the adjusted or recorded one or more parameter selected for improving an affect associated with a severity of a crash (e.g., to generate a classification for one or more other simulated collisions, etc.).

As shown in FIG. 3, at step 304, process 300 may include automatically detecting a collision in a simulated driving scenario based on an intersection between an affected portion of AV1 and at least one affected portion of the at least one road actor. For example, severity classification system 108 automatically detects a collision in a simulated driving scenario of the plurality of simulated driving scenarios based on an intersection between one or more affected portions of AV1 and at least one affected portion of the at least one road actor.

In some non-limiting embodiments or aspects, severity classification system 108 automatically detects a collision by detecting one or more affected portions of AV1 overlapping with an affected portion of road Actor1. Severity classification system 108 may be operated to automatically detect a collision by finding an area of AV1 represented at least partially by a virtually simulated bounding box (e.g., a simulated bounding box comprising a plurality of panels that correspond to a surface of a vehicle, such as four panels, one in front, one in back and one on each side, etc.). The simulated bounding box is overlapping with a bounding box of road Actor1 (e.g., in the scenario where road Actor1 is a vehicle), if the panels of AV1 and the panels representing road Actor1, overlap. For example, severity classification system 108 detects an overlapping area of road Actor1 represented virtually by a simulated bounding box and compares it to the area of AV1. In another example, severity classification system 108 determines an overlap based on a bounding box of a simulated polygon of a road actor not including a vehicle (e.g., a plurality of panels that correspond a non-vehicle object in or near a road, etc.). In some non-limiting embodiments or aspects, finding at least one affected portion of a road actor in a simulated polygon representing a non-vehicle object in the road (e.g., a light post, a barrier, debris, etc.), comprises determining the non-vehicle road actor is not a vehicle, and generating a simulated polygon of the at least one road actor instead of a bounding box.

In some non-limiting embodiments or aspects, the one or more affected portions of AV1 and the at least one affected portion of Actor1 are each defined by one or more affected panels.

In some non-limiting embodiments or aspects, determining the intersection between the one or more affected portions of AV1 and the affected portion of Actor1 is provided by first checking each panel of the plurality of panels of the simulated bounding box of AV1 for an area of intersection with the simulated bounding box of the at least one road Actor1. For example, severity classification system 108 compares each panel of the plurality of panels of the simulated bounding box of AV1 to each panel of a plurality of panels of a bounding box of Actor1. Likewise, in such an example, severity classification system 108 compares each panel of a plurality of panels of a bounding box of Actor1 to each panel of the plurality of panels of the simulated bounding box of AV1 to determine areas of intersection.

Alternatively, severity classification system 108 may determine if AV1 intersects with a road actor that is not a vehicle (e.g., a non-vehicle road actor, etc.). In such cases, severity classification system 108 determines the intersection between the one or more affected portions of AV1 and the affected portions of the road actor, which is provided by severity classification system 108 checking each panel of the plurality of panels of the simulated bounding box of AV1 for an intersection with a bounding polygon representing the non-vehicle object. For example, severity classification system 108 compares only each panel of the plurality of panels of the simulated bounding box of AV1 to the simulated polygon. The simulated polygon is more efficient to identify points of intersection where collision damage may occur in the plurality of panels of the simulated bounding box of AV1 colliding with a non-vehicle road actor where generating one or more panels may not sufficiently represent an object. If it is determined otherwise by severity classification system 108, a plurality of panels may be used instead.

Figures 4B, 4C, 4D, 4E:

In some non-limiting embodiments or aspects, a depth of collision is calculated based on the intersection area. With reference to FIG. 4, (as described hereinbelow), a depth of collision is shown, which is a distance between an intersection polygon in an area defined by the plurality of affected panels. In this example, the intersection polygon represents an area intersecting between the one or more affected portions of the AV1 and the at least one affected portion of the at least one road actor. For example, the depth of collision may be calculated as the minimum distance required to move the bounding box of the opposite actor along the normal vector of the panel (e.g., a panel in a bounding box of a vehicle (or other object) in order for no intersection to be present. The depth of collision may be determined by calculating a maximum distance between two sets of points (i.e., the bounding box of the opposite actor and the bounding pox of the AV1, etc.). For example, a Hausdorff distance is calculated to provide a measure of the mutual proximity, such as a distance calculated to indicate the maximal distance between points of one polygon in relation to points of the other polygon. In an alternative distance, other measurements between points may be used, such as the shortest distance to a point of each polygon, irrespective of all other points of the polygons, that may be applied (e.g., FIGS. 4A-4E shows a depth of collision with respect to each affected panel).

In some non-limiting embodiments or aspects, process 300 includes recording a position of AV1 and a relative velocity between the AV1 and the Actor1 at a point of the simulated collision, and a position of a simulated bounding box of the AV and Actor1 at the moment of a detected simulated collision. For example, severity classification system 108 records a position of the AV1 and a relative velocity generated between the AV1 and Actor1 at a point of the simulated collision, and a position of a simulated bounding boxes of the AV and Actor1 at the moment of a detected simulated collision.

In some non-limiting embodiments or aspects, severity classification system 108 (or simulated environment 102) records a position of AV1 at the moment a collision is detected. For example, severity classification system 108 (or simulated environment 102, self-driving system 104, etc.) initiates a recording of simulated collision, such as when it detects a collision as described hereinabove, such as with road Actor1. The simulated collision may occur any time there is an intersection between the bounding boxes of AV1 and road Actor1 (e.g., the bounding box of road Actor1, one or more panels comprising the surface of the bounding box, etc.). For example, severity classification system 108 detects a collision based on an overlapping area (e.g., an intersection, etc.) forming an intersection polygon in an area defined between the plurality of affected panels of AV1 and road Actor1. In this scenario, a recording is generated to capture details about the objects and area of intersection associated with the affected portions of the AV1 and the affected portions of road Actor1. In some examples, the collision depth is similar to this intersection polygon (e.g., intersection area of the AV1 with a vehicle in the road, etc.) and may be determined to be a depth or other distance of the intersection area where one or more affected panels that represent an area of the AV1 overlap with the affected panels of the road Actor1.

In some non-limiting embodiments or aspects, a relative velocity (e.g., velocity relative to Actor1 and based on the bounding box positions, e.g., the bounding box position of the AV1, the bounding box position of the road Actor1, etc.), including a velocity between the AV1 and Actor1 at a point of the simulated collision, and other simulated environment data and/or information (e.g., positions, size, speed, weight, direction, mover type, and other vehicle parameters, predictions, or detections, etc.), are recorded at the first moment the collision is detected. In such an example, the collision severity may comprise a recording of variables for a predetermined threshold period or based on aspects of the recorded data as it is captured. In some examples, the recorded relative velocity, positions of the bounding boxes, and other information is continually recorded for a period (e.g. a period equal to the first 250 ms, etc.) after a first moment of the simulated collision. For example, severity classification system 108 generates a collision severity score that includes generating a collision severity score for the one or more affected panels for a predetermined period after the initial moment of the simulated collision.

In some non-limiting embodiments or aspects, generating a scenario in a simulated environment is based on at least one of a simulation, resimulation, or a playforward. Such an example, may include generating a scenario defined by a resimulation or a playforward, such that the simulated environment comprises virtual roadways mirroring roads in a real environment where a collision actually occurred, and the scenario may be based on details about the collision that occurred in real environment 106. In some examples, the collision may not have occurred, but was avoided and a resimulation or a playforward may be configured to replay such a simulation to determine what may have happened if parameters of the AV1, Actor1, or the road are adjusted.

As shown in FIG. 3, at step 306, process 300 includes generating collision impact scores for affected portions of AV1 and Actor1, wherein each impact score of the plurality of collision impact scores signals a severity of a different impact type of the at least one road actor colliding with AV1. For example, severity classification system 108 generates a plurality of collision impact scores for the one or more affected portions of AV1 and the at least one affected portion of the at least one road actor, wherein each impact score of the plurality of collision impact scores signals a severity of a different impact type of the at least one road actor colliding with AV1.

In some non-limiting embodiments or aspects, generating a plurality of collision impact scores, includes generating a score for classifying the severity of the impact of the collision for each affected panel of the plurality of panels. For example, severity classification system 108 generates a plurality of collision impact scores that includes generating for each affected panel of the plurality of panels, a compression impact score and a shear impact score. In such an example, the severity of the impact is determined by comparing the compression impact score with the shear impact score. In some examples, only a compression impact score or a shear impact score is calculated, based on the depth of the crash, the velocity, and driving direction, or other factors which may impact the collision. In other examples, additional impact scores may be used, such as a rear-end impact score, a head-on impact score, and/or a non-vehicle actor impact score.

In an example, the compression impact score for the simulated collision is used to signal or identify a severity of a direct impact force received on AV1 and produced by the Actor1. For example, a direct impact score of AV1 is calculated while the road Actor1 is moving toward the center of an affected panel of AV1 (e.g., moving into the center of a bounding box of AV1). The compression impact score is based on a component of the relative velocity determined to be orthogonal to a plane of the affected panel. It is generated to provide the velocity of Actor1 (or the relative velocity of both actors) that is perpendicular to a plane on the surface of AV1.

In another example, a shear impact score of the simulated collision is used to signal or identify a severity of a sliding force received by AV1 and produced by road Actor1 . For example, a direct impact score of AV1 is calculated while the road Actor1 is moving laterally into an affected panel of AV1. In this example, the shear impact score is based on the component of the other mover's relative velocity determined to be parallel to the surface of the affected panel of AV1.

Further details of the collision impact scores, including a description of the formulas used to generate the compression impact score and the shear impact score can be found in the description of FIGS. 5A and 5B.

As shown in FIG. 3, at step 308, process 300 determines a severity of the simulated collision based on the larger score of the plurality of collision impact scores for the affected portion of the AV1 and at least one affected portion of the at least one road actor. In some non-limiting embodiments or aspects, severity classification system 108 determines a severity of the collision based on the plurality of collision impact scores, at least one of the one or more affected portions of AV1, and the at least one affected portion of Actor1. In scenarios described herein, it is appropriate to interchange Actor1 (e.g., a road actor) and AV when using scores and depending on the same type of collision.

In some non-limiting embodiments or aspects, combinations of panels and their impact score are used to determine a severity score using the table below. The highest of all combinations will be used as the final impact score. For example, each combination of panels and corresponding impact scores are used for determining a severity score. In some examples, the mover type, AV panel, and/or impact score are used to look up the collision severity, using the table shown and described below.

In some non-limiting embodiments or aspects, a severity lookup table is used to determine a score for a simulated collision. For example, a collision severity score can classify a simulated collision based on collision values represented as a series of data points (e.g., AV panel, mover panel, mover type, impact score, AV surface: Front, front/side, side/rear, etc.). In some examples, actor surfaces are not applicable for other non-vehicle objects.

A collision severity score represents the mapping of these four values to a collision severity:

| Regular Vehicle Impact Score Thresholds (mph) | | | | | | |
|---|---|---|---|---|---|---|
| Interaction | AV Surface | Actor Surface | S0 | S1.1 | S1.2 | S2+ |
| AV actor head on | front | front | ≤1 | >1 to ≤10 | >10 to ≤20 | >20 |
| AV rear ends Actor | front | rear | ≤1 | >1 to ≤10 | >1 | N/A |

In the above lookup table, in a simulated collision with another vehicle, if the AV front panel and mover front panel have an impact score of 3 mph, the collision is tentatively classified as S1.1 from the above lookup table. For all combinations of panels and their collision impact scores, a severity will be determined. Different combinations of panels may alter the score or change it in different ways. Interacting with regular road actors (front, side, and rear combinations) may also alter a score. The highest of all combinations will be used as the final impact score.

Simulated collisions may be used to classify severity involving types, such as head-on, t-bone, sideswipe, or rear-end. For example, simulated collisions may be used to generate vehicle severity impact scores. A severity score may be at least partially based on a factor of velocity (e.g., a factor that can be adjusted for vehicle to vehicle relative velocity, etc.). In some examples, a severity score is at least partially based on a midpoint speed for a side impact. In some non-limiting embodiments or aspects, the y-component is specified with a severity score based on how much it exceeds certain standards speed. A severity score is assigned for a collision greater than 25% vehicle overlap for frontal collisions, such as for adjusting an impact score based on a speed of the vehicle according to a size. In some non-limiting embodiments or aspects, parameters are adjusted for severity classification system 108 to interact with large or small vehicle actors. In some non-limiting embodiments or aspects, a simulation may determine how an AV would react when turning right and cutting off a road actor parking a car where the road actor had the right of way. In some examples, side or rear collisions may signal that a vulnerable road actor collided into the AV, where the AV had right of way. Severity adjusted higher for this use case.

In some non-limiting embodiments or aspects, classifying includes updating self-driving system 104, so that self-driving system 104 properly determines a simulated collision, for example, self-driving system 104 is updated to move to avoid a newly perceived collision (e.g., a scored collision). For example, information of AV1 is used for classifying one or more simulated collisions during a simulated collision, during simulation, self-driving system 104 may be updated to include the evasive move that avoids a simulated collision which has been previously classified based on a dependency with at least one of: a shear impact score, a compression impact score, a side swipe impact score, a rear-end impact score, or a non-vehicle object impact score. In such examples, a plurality of factors includes the one or more affected portions of AV1, the at least one affected portion of Actor1, the simulated bounding box of the AV, or a simulated bounding box of Actor1. In some cases, if AV1 does not avoid a collision, a severity classification system 108 classifies a simulated collision with impact scores only for a panel of AV1 that overlap with Actor1 by more than a predetermined threshold.

In some non-limiting embodiments or aspects, severity classification system 108 may classify based on factors including, interaction with a vulnerable road user ("VRU"), contact between Actor1 and an AV surface (e.g., a front, front/side, side/rear, etc.). Severity classification system 108 may classify instructions with regular road actors (e.g., front, side, rear combinations, etc.). In some non-limiting embodiments or aspects, an overlap test determines an amount of overlap between vehicles. In some non-limiting embodiments or aspects, air bag deployment is a factor (e.g., a midpoint value between a No-Deploy and a Must-Deploy threshold.

In some non-limiting embodiments or aspects, severity classification system 108 generates severity classification for simulated crashes based on a first impact score at a predetermined threshold that is greater for affected portions of AV1 than the at least one affected portion of Actor1. In some examples, each impact score of the plurality of collision impact scores signals or represents a different impact of Actor1 with AV1.

In some non-limiting embodiments or aspects, while classifying a severity of a simulated collision, severity classification system 108 generates the plurality of impact scores to include a plurality of score levels (e.g., generating the plurality of impact scores to include a first impact score and a second impact score). Next, severity classification system 108 automatically forms a dependency between the executing self-driving system 104 and the impact scores (e.g., including impact scores generated after solving a particular scenario, etc.) while operating AV1 within conditions representative of a plurality of driving factors. In such an example, self-driving system 104 scores the AV after a collision associated with the impact scores and updates a self-driving system 104 based on an impact score generated after solving a particular scenario.

In some examples, the simulation results may not directly feed to the real AV. However, if a new AV software version has a collision that was not in previous versions (or has been determined to be worse than in previous versions based on collision impact scores, or has been detected based on collision impact scores, or has been newly simulated and prevented in a simulated environment, etc.), the new version of software including updated collision detection may be placed on an AV (or a fleet of AV's, etc.). In some examples, the new version with the updated collision detection may not be integrated on the vehicle until the results may be analyzed and or replayed in a simulated environment.

In some examples, severity classification system 108 generates and scores a simulation that enables a self-driving system to avoid a simulated collision based on similar factors or conditions. Alternatively, a change to self-driving system 104 configured to avoid a particular set of factors of a collision, may enable self-driving system 104 to control an AV to avoid a collision.

In some non-limiting embodiments or aspects, self-driving system 104 controls AV1 based on automatically forming a dependency between at least one of the impact scores and a plurality of factors for controlling an AV, thereby controlling and generating navigation instructions for AV1 based on instructions from self-driving system 104 configured to avoid a collision after comparing the shear impact score and the compression impact score for a similar simulated collision.

With reference to FIGS. 4A-4E, diagrams of non-limiting embodiments or aspects of a collision depth detection in a simulated collision comprising a collision depth are provided. FIGS. 4B-4E show a depth with respect to each panel affected (e.g., within a threshold) corresponding to the collision depth provided in FIG. 1 and FIG. 4A for the simulated collision.

With reference to FIG. 4A, FIG. 4A is a diagram showing a depth of collision between two bounding boxes. As shown, the simulated collision is detected in the area of intersection between the bounding boxes of AV1 and the bounding box of the simulated road actor (e.g., Actor1). For example, severity classification system 108 measures, generates and/ or records a collision depth (e.g., a collision area, a set of points or a vector representing a collision impact, etc.), such as collision depth 402 in the area of the portions of the affected bounding box of AV1 and Actor1. In some examples, severity classification system 108 measures, generates and/or records a collision depth over a period of time, such as each predetermined increment (e.g., 5 ms, etc.) over a period of time (e.g., 250 ms, etc.) starting after a collision is initially detected or transmits a signal to simulated environment 102 to measure or record a collision depth and receives a signal from simulated environment 102. In some cases, severity classification system 108 then generates and records a maximum distance length of the simulated collision between each affected portion of the bounding boxes.

FIG. 4B shows a depth of collision with respect to a first affected panel of Actor1. For example, severity classification system 108 calculates, for each panel of the plurality of affected panels, a collision depth including a collision depth with respect to each panel. In some examples, collision depth is the distance required to move the simulated bounding box of Actor1 along a normal vector of an affected panel of the plurality of affected panels, to a position where no intersection is determined to be present. For example, severity classification system 108 measures, generates and/or stores a collision depth between a point of collision (e.g., shown by the start of the arrow) and a point on the first affected panel (i.e., shown by the end of the arrow head in FIG. 4B, touching the affected panel). A collision depth with respect to the panel is perpendicular to the panel. Severity classification system 108 may calculate a depth of a collision between a point of the collision (e.g., shown by the bounding boxes) and a point on the first affected panel of Actor1 indicating a depth of collision with respect to a particular panel (e.g., front panel on Actor1, etc.).

FIG. 4C is a diagram showing a depth of collision with respect to a second affected panel of Actor1. For example, a severity classification system 108 measures, generates, and/ or records a collision depth between a point of collision (e.g., shown by the start of the arrow) and a point on a second affected panel (i.e., shown by the end of the arrow head in FIG. 4C, touching the affected panel). The collision depth with respect to the second affected panel is perpendicular to the second affected panel.

FIG. 4D is a diagram showing a depth of collision with respect to a third affected panel of AV1. For example, severity classification system 108 measures, generates and/ or records a collision depth between a point of collision (e.g., shown by the start of the arrow) and a point on the third affected panel (i.e., shown by the end of the arrow head in FIG. 4D, touching the affected panel). The collision depth with respect to the third affected panel is perpendicular to the third affected panel.

FIG. 4E is a diagram showing a depth of collision with respect to a fourth affected panel of AV1. For example, severity classification system 108 measures, generates and/ or stores a collision depth between a point of collision (e.g., shown by the start of the arrow) and a point on the fourth affected panel (i.e., shown by the end of the arrow head in FIG. 4E touching the affected panel). In some non-limiting embodiments or aspects, a collision impact score is generated for each affected panel in FIGS. 4A-4E. The collision depth with respect to the fourth affected panel is perpendicular to the fourth affected panel.

FIG. 5A and FIG. 5B show a collision (e.g. a t-bone collision) in some non-limiting embodiments or aspects, for which a compression impact score is generated. For example, severity classification system 108 generates a compression impact score based on the t-bone impact collision as shown. In other examples (not shown here), a compression impact score may be generated for compression collisions in other portions of a vehicle, such as rear-end, head-on, oblique side swipe, etc. A compression impact score on a given panel may be the greatest (e.g., the highest score) when the other actor's relative motion is antiparallel to the panel's outward normal vector, such as in a t-bone collision.

In some non-limiting embodiments or aspects, a compression impact score ($I_{compression}$) is calculated using a given panel's normal vector, the other vehicle's velocity relative to the panel, and the depth of the collision with respect to that panel. For example, the compression impact score ($I_{compression}$) for a panel is calculated based on the following equation:

$$I_{compression}=\max(0, \ldots n_{panel} \cdot \vec{v}_{rel});$$

The dot product between the negated panel normal ($-\hat{n}_{panel}$) and the relative velocity ($v_{rel}$) calculates the component of the relative velocity that is orthogonal (e.g., perpendicular) to a surface of the affected panel and where the $\hat{n}_{panel}$ is outward-facing in a direction toward the outside of the vehicle (e.g. facing away from the inside of the vehicle, generally outward facing, etc.) and $-\hat{n}_{panel}$ is the inward-facing normal unit vector to the panel, while is the relative velocity between the two actors (e.g., Actor1 and AV1). In an example, where a mover is traveling anti-parallel (e.g., directly or parallel in an opposite direction of the panels normal vector as shown in FIG. 5B) towards a panel, the compression impact score will be the mover's relative velocity. Thus, If a mover is t-boning the AV, it's velocity is pointed towards the inside of the AV. Positive n is outward-facing, which is the opposite direction of the mover's velocity, and n is negated to achieve a vector that faces inwards. In such an example, the result is that |−n̂° v| is a large positive value when the other mover's velocity is pointed directly at the panel.

In some non-limiting embodiments or aspects, a compression impact score is only calculated on affected panels having an overlap length with the other mover that is greater than a predetermined threshold (e.g., 0.5 m, etc.). In such an example, the length of the panel itself overlaps with Actor1.

The overlap depth is calculated for every panel. The depth may be calculated based on the angle of impact and the velocity. For example, a hausdorff depth is computed for each panel (each affected panel) with no limitations. However, as shown in FIG. 5A, severity classification system 108 may only calculate a compression impact score on the AV's right side panel and the front panel of Actor1 because the left and right side panel of Actor1 have only a slight overlap (e.g., overlap depth) with the AV1 (e.g., overlap length 406 on the right is less than 0.5 m, etc.). The overlap length can also be adjusted to a new threshold to increase panel calculations or decrease calculations, which can effect efficiency and accuracy of collision impact calculations. For example, the part of the front panel of AV1 that overlaps with Actor1 is 408 and the collision depth is 406 can be used as a limit or filter for a collision impact score. The severity classification system 108 disregards the right side panel of AV1 because the overlap length is less than (<) 0.5 m.

With reference to FIG. 5B, the affected panel shown in the vector diagram refers to the AV's right side panel that receives the effective impact from the collision. In this example, the effect to the affected panel is determined from the normal vector of the affected panel and the relative velocity (e.g., the relative velocity vector, etc.) of the Actor.

FIG. 6 shows a collision (e.g., side-swipe), in some non-limiting embodiments or aspects, for which a shear impact score is generated according to principles of the present disclosure. For example, severity classification system 108 generates a shear impact score based on a side impact collision. Side-swipe collisions generally have high shear impact scores with respect to side panels because the relative motion is nearly perpendicular to the panel normal vector as shown in the vector diagram. The panel is affected differently in this example, as compared to the example of FIG. 5A, where the relative motion is nearly anti-parallel to the normal vector.

In some non-limiting embodiments or aspects, severity classification system 108 generates a shear Impact score ($I_{shear}$) for a panel. For example, a shear impact score is generated for each impact. The shear Impact score represents the motion of the other mover perpendicular to a panel (or in a near perpendicular direction, in a more perpendicular direction as compared to an anti-parallel direction, etc.), and severity classification system 108 applies discount factor if the shear collision is shallow (e.g., below a predetermined threshold. The shear Impact score ($I_{shear}$) is calculated based on the following equation:

$$I_{shear} = \Phi(d) * \|\hat{n}_{panel} \times \vec{v}_{rel}\|$$

The cross product between the panel normal and the relative velocity gives the component of the relative velocity which is parallel to the surface of the vehicle. The shear Impact score ($I_{shear}$) provides a model of the complex material process of how sheering auto-body materials reacts to a jerk and impulse experienced by the passengers, where the discount is determined by:

$$\phi(d) = \begin{cases} 0 & \text{if } d \le \text{mirror threshold} \\ \min(Ad, \phi_{max}) & \text{if } d > \text{mirror threshold} \end{cases}$$

In some non-limiting embodiments or aspects, A is a constant representing an amount for determining a discount of shallow collisions. For example, A 32 0.87, when the scoring goal is to discount a 0.5 m deep, exemplary side-swipe angle, with an actual velocity of 23 mph, such that the discounted velocity is equal to a score of 10 mph, where $\phi_{max}$ is equal to the constant 1, d is the intersection depth with respect to the current panel; and mirror threshold is set equal to a distance the side-view mirror extends out from the surface of the vehicle.

In some non-limiting embodiments or aspects, the shear Impact score ($I_{shear}$) models the complex material process of shearing auto-body materials. In addition, the shear Impact score ($I_{shear}$) translates the collision information into the model for classifying the jerk and impulses experienced by the passengers of a vehicle involved in such a collision.

Those skilled in the art should understand that the embodiment of the method of the present disclosure can be provided as a method, a system, or a computer program product. Accordingly, the present disclosure can take the form of a complete hardware embodiment, a complete software embodiment, or an embodiment combining software and hardware aspects. Moreover, the present disclosure can take the form of a computer program product embodied on one or more computer-usable non-transitory storage media (including, but not limited to, a disk memory, a CD-ROM, an optical memory or the like) containing computer usable program codes.

The present disclosure is described with reference to the flow diagrams and/or block diagrams of the method, device (system) and the computer program product in the embodiments of the present invention. It should be understood that computer program instructions can achieve each flow and/or block in the flow diagrams and/or block diagrams and the combination of the flows and/or blocks in the flow diagrams and/or block diagrams. These computer program instructions can be provided to a special-purpose computer, an embedded processor or processors of other programmable data processing devices to generate a machine, such that the instructions executed by computers or the processors of other programmable data processing devices generate apparatuses used for achieving specified functions in one or more flows in the flow diagrams and/or one or more blocks in the block diagrams.

These computer program instructions can also be stored on computer readable memories that are capable of guiding the computers or the other programmable data processing devices to work in a specific manner so that the instructions stored in the computer readable memories generate a product including an instruction apparatus and the instruction apparatus implements specified functions in one or more flows in the flow diagrams and/or one or more blocks in the block diagrams.

These computer program instructions can also be loaded onto the computers or the other programmable data processing devices so that a series of operation steps are executed on the computers or the other programmable devices to generate the processing implemented by the computers, therefore the instructions executed on the computers or the other programmable devices provide steps for implementing the specified functions in one or more flows in the flow diagrams and/or one or more blocks in the block diagrams.

Although the above systems, methods, and computer program products have been described in detail for the purpose of illustration based on what is currently considered to be the most practical and preferred embodiments, it is to be understood that such detail is solely for that purpose and that the present disclosure is not limited to the described embodiments but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment or example.

In order to avoid obscuring the concepts of the present disclosure, some details known in the art are not described. Those skilled in the art can fully understand how to implement the technical solutions disclosed herein according to the above description. For the apparatus embodiment, the involved steps have a corresponding relationship with the contents in the method embodiment, thus related parts can refer to a part of illustration in the method embodiment.

Some specific embodiments of the present disclosure have been described in detail by way of example, those skilled in the art should understand that the above embodiments are merely used for illustrating, rather than limiting the scope of the present disclosure. Those skilled in the art should understand that modifications or equivalent substitutions to a part of technical features can be made to the above embodiments without departing from the scope and spirit of the present disclosure. The scope of the present disclosure is defined by the appended claims.

What is claimed is:

1. A computer-implemented method for generating a severity score in a simulated collision, comprising:

providing, by one or more processors, simulations to a self-driving system operating in a simulated environment, the self-driving system controlling a simulated autonomous vehicle (AV) in a road during a plurality of simulated driving scenarios involving at least one road actor;

automatically detecting, by the one or more processors, a collision in a simulated driving scenario of the plurality of simulated driving scenarios based on an intersection between one or more affected portions of the simulated AV and at least one affected portion of the at least one road actor;

generating, by the one or more processors, a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classifying, by the one or more processors, the severity of the collision based on the larger score of the plurality of collision impact scores for the affected portion of the simulated AV and at least one affected portion of the at least one road actor, wherein the one or more affected portions of the simulated AV and the at least one affected portion of the at least one road actor comprise a plurality of affected panels, and the method further comprising generating a scenario in the simulated environment based on at least one of a simulation, a resimulation, or a playforward, wherein the simulated environment comprises virtual roadways mirroring roads in a real environment.

2. The computer-implemented method of claim 1, wherein the simulated AV comprises a simulated bounding box including a plurality of panels that correspond to a surface of the simulated AV, wherein the at least one road actor comprises the simulated bounding box including a plurality of panels that correspond to a surface of a real world vehicle, or alternatively, a simulated polygon representing a non-vehicle object in the road, and wherein the intersection between the one or more affected portions of the simulated AV and the at least one affected portion of the at least one road actor is determined by checking each panel of the plurality of panels of the simulated bounding box of the simulated AV for an intersection with the simulated bounding box of the at least one road actor, or alternatively, a bounding polygon representing the non-vehicle object, and further wherein the intersection between the at least one affected portion of the at least one road actor and of the one or more affected portions of the simulated AV is determined by checking each panel of the plurality of panels of the simulated bounding box of the at least one road actor for an intersection with the simulated bounding box of the simulated AV.

3. The computer-implemented method of claim 1, further comprising:

calculating an intersection polygon in an area defined by the plurality of affected panels, the intersection polygon representing an area intersecting the one or more affected portions of the simulated AV and the at least one affected portion of the at least one road actor.

4. The computer-implemented method of claim 3, further comprising:

calculating, for each panel of the plurality of affected panels, a collision depth including a minimum distance required to move the simulated bounding box of the at least one road actor along a normal vector of an affected panel of the plurality of affected panels, to a position where no intersection is determined to be present.

5. The computer-implemented method of claim 1, wherein generating the plurality of collision impact scores, further comprises:

generating for each affected panel of the plurality of panels, a compression impact score and a shear impact score, wherein the compression impact score for the simulated collision, signals a severity of a direct impact force received on the simulated AV by the at least one road actor while moving toward a center of the affected panel of the plurality of affected panels, and based on a component of the relative velocity determined to be orthogonal to a plane of the affected panel, provides the velocity of the at least one road actor perpendicular to a plane on a surface of the at least one road actor, and wherein a shear impact score of the simulated collision, signals a severity of a sliding force received by the simulated AV by the at least one road actor, moving laterally into the affected panel of the plurality of affected panels, and based on the component of the at least one road actor's relative velocity which is determined to be parallel to the surface of the panel.

6. The computer-implemented method of claim 5, wherein one or more of the collision impact scores are calculated only for affected panels which overlap with the at least one road actor by more than a predetermined threshold.

7. The computer-implemented method of claim 5, wherein a discount penalty is applied to the shear impact score to compensate for shallow collisions.

8. The computer-implemented method of claim 7, further comprises a mirror-threshold for eliminating the shear impact score, wherein the shear impact score is eliminated if an intersection depth of the affected panel is less than a distance a mirror extends outward from the surface of the simulated AV.

9. The computer-implemented method of claim 1, wherein classifying a severity of the collision, further comprises:

generating the plurality of impact scores to include a plurality of score levels;

automatically forming a dependency between the impact scores and a plurality of factors for controlling the simulated AV; and updating a self-driving system based on an impact score generated for the simulated collision.

10. The computer-implemented method of claim 9, wherein updating the self-driving system further comprises configuring the self-driving system for an evasive move in response to perceived information of the simulated AV, based on classifying one or more simulated collisions, wherein the evasive move avoids the simulated collision previously classified based on a dependency with at least one of: a shear impact score, a compression impact score, a side swipe impact score, a rear-end impact score, or a non-vehicle object impact score, and wherein the plurality of factors includes at least one of: the one or more affected portions of the simulated AV, the at least one affected portion of the at least one road actor, the simulated bounding box of the AV, the simulated bounding box of the at least one road actor; and classifying the simulated collision with the one or more of the impact scores only for a panel of the simulated AV that overlap with the at least one road actor by more than a predetermined threshold.

11. A system for severity classification with a simulated collision, comprising:

a memory; and one or more processors coupled to the memory, and configured to:

provide simulations to a self-driving system operating in a simulated environment, the self-driving system controlling a simulated autonomous vehicle (AV) in a road during a plurality of simulated driving scenarios involving at least one road actor;

automatically detect a collision in a simulated driving scenario of the plurality of simulated driving scenarios based on an intersection between one or more affected portions of the simulated AV and at least one affected portion of the at least one road actor;

generate a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classify the severity of the collision based on the larger score of the plurality of collision impact scores for the affected portion of the simulated AV and at least one affected portion of the at least one road actor, wherein the one or more affected portions of the simulated AV and the at least one affected portion of the at least one road actor comprise a plurality of affected panels, and the one or more processors are further configured to generate a scenario in the simulated environment based on at least one of a simulation, a resimulation, or a playforward, wherein the simulated environment comprises virtual roadways mirroring roads in a real environment.

12. The system for severity classification of claim 11, wherein the simulated AV comprises a simulated bounding box including a plurality of panels that correspond to a surface of the simulated AV, wherein the at least one road actor comprises the simulated bounding box including a plurality of panels that correspond to a surface of a real world vehicle, or alternatively, a simulated polygon representing a non-vehicle object in the road, and wherein the intersection between the one or more affected portions of the simulated AV and the at least one affected portion of the at least one road actor is determined by checking each panel of the plurality of panels of the simulated bounding box of the simulated AV for an intersection with the simulated bounding box of the at least one road actor, or alternatively, a bounding polygon representing the non-vehicle object, and further wherein the intersection between the at least one affected portion of the at least one road actor and of the one or more affected portions of the simulated AV is determined by checking each panel of the plurality of panels of the simulated bounding box of the at least one road actor for an intersection with the simulated bounding box of the simulated AV.

13. The system for severity classification of claim 11, wherein the one or more processors are further configured to:

calculate an intersection polygon in an area defined by the plurality of affected panels, the intersection polygon representing an area intersecting the one or more affected portions of the simulated AV and the at least one affected portion of the at least one road actor.

14. The system for severity classification of claim 13, wherein the one or more processors are further configured to:

calculate, for each panel of the plurality of affected panels, a collision depth including a minimum distance required to move the simulated bounding box of the at least one road actor along a normal vector of an affected panel of the plurality of affected panels, to a position where no intersection is determined to be present.

15. The system for severity classification of claim 11, wherein the one or more processors generating the plurality of collision impact scores, are further configured to:

generate for each affected panel of the plurality of panels, a compression impact score and a shear impact score, wherein the compression impact score for the simulated collision, signals a severity of a direct impact force received on the simulated AV by the at least one road actor while moving toward a center of the affected panel of the plurality of affected panels, and based on a component of the relative velocity determined to be orthogonal to a plane of the affected panel, provides the velocity of the at least one road actor perpendicular to a plane on a surface of the at least one road actor, and wherein the shear impact score of the simulated collision, signals a severity of a sliding force received by the simulated AV by the at least one road actor, moving laterally into the affected panel of the plurality of affected panels, and based on the component of the at least one road actor's relative velocity which is determined to be parallel to the surface of the panel.

16. The system for severity classification of claim 15, wherein one or more of the collision impact scores are calculated only for affected panels which overlap with the at least one road actor by more than a predetermined threshold.

17. The system for severity classification of claim 15, wherein a discount penalty is applied to the shear impact score to compensate for shallow collisions.

18. A computer program product for severity classification of simulated collisions, comprising at least one non-transitory computer-readable medium including one or more instructions that, when executed by at least one processor, cause the one or more processors to:

provide simulations to a self-driving system operating in a simulated environment, the self-driving system controlling a simulated autonomous vehicle (AV) in a road during a plurality of simulated driving scenarios involving at least one road actor;

automatically detect a collision in a simulated driving scenario of the plurality of simulated driving scenarios based on an intersection between one or more affected portions of the simulated AV and at least one affected portion of the at least one road actor;

generate a plurality of collision impact scores for the one or more affected portions of the simulated AV and the at least one affected portion of the at least one road actor, wherein each impact score of the plurality of collision impact scores signals a severity of a different impact type of the at least one road actor colliding with the simulated AV; and classify the severity of the collision based on the larger score of the plurality of collision impact scores for the affected portion of the simulated AV and at least one affected portion of the at least one road actor, wherein the one or more affected portions of the simulated AV and the at least one affected portion of the at least one road actor comprise a plurality of affected panels, and the at least one non-transitory computer-readable medium further includes one or more instructions that, when executed by the at least one processor, cause the one or more processors to generate a scenario in the simulated environment based on at least one of a simulation, a resimulation, or a playforward, wherein the simulated environment comprises virtual roadways mirroring roads in a real environment.

* * * * *